United States Patent
Honda et al.

(10) Patent No.: US 10,481,313 B2
(45) Date of Patent: Nov. 19, 2019

(54) IMAGE CAPTURING APPARATUS

(71) Applicant: SHARP KABUSHIKI KAISHA, Sakai, Osaka (JP)

(72) Inventors: Daisuke Honda, Sakai (JP); Takashi Nakano, Sakai (JP); Suguru Kawabata, Sakai (JP); Takahiro Takimoto, Sakai (JP); Kazuhiro Natsuaki, Sakai (JP); Masayo Uchida, Sakai (JP); Masaaki Uchihashi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/095,303

(22) PCT Filed: Mar. 8, 2017

(86) PCT No.: PCT/JP2017/009155
§ 371 (c)(1),
(2) Date: Oct. 19, 2018

(87) PCT Pub. No.: WO2017/187804
PCT Pub. Date: Nov. 2, 2017

(65) Prior Publication Data
US 2019/0162890 A1    May 30, 2019

(30) Foreign Application Priority Data

Apr. 28, 2016    (JP) .................................. 2016-091839

(51) Int. Cl.
*G02B 5/30*    (2006.01)
*H01L 27/146*    (2006.01)

(52) U.S. Cl.
CPC .............. *G02B 5/3058* (2013.01); *G02B 5/30* (2013.01); *H01L 27/1462* (2013.01); *H01L 27/14625* (2013.01)

(58) Field of Classification Search
CPC ..... G02B 5/3058; G02B 5/30; H01L 27/1462; H01L 27/14625
See application file for complete search history.

(56) References Cited

U.S. PATENT DOCUMENTS

| 2006/0039069 A1 | 2/2006 | Hayashi et al. |
| 2008/0252799 A1 | 10/2008 | Lee et al. |

(Continued)

FOREIGN PATENT DOCUMENTS

| JP | 2006-058615 A | 3/2006 |
| JP | 2006-154382 A | 6/2006 |

(Continued)

*Primary Examiner* — David Vu
(74) *Attorney, Agent, or Firm* — ScienBiziP, P.C.

(57) ABSTRACT

An image capturing apparatus that includes a polarizing filter of a slit type in which polarization characteristics are improved is realized. A polarizing unit (10) of an image capturing apparatus (100) includes a first polarizer layer (120a) and a second polarizer layer (120b) that hold a dielectric layer (14) therebetween, and a plurality of slits (13) that are arranged at regular intervals in a predetermined direction are formed in each of the first polarizer layer (120a) and the second polarizer layer (120b). A forming material of each of the first polarizer layer (120a) and the second polarizer layer (120b) and a forming material of a wiring layer that controls an operation of a light receiving unit (11) are selected from Al, Si, Cu, Au, Ag, Pt, W, Ti, Sn, In, Ga, Zn, and a compound or alloy that contains at least one of the foregoing.

20 Claims, 19 Drawing Sheets

(56) References Cited

U.S. PATENT DOCUMENTS

2009/0116029 A1* 5/2009 Ohtera ...................... G01J 3/02
                                                                356/456
2010/0282945 A1   11/2010 Yokogawa
2014/0362200 A1   12/2014 Kanamori et al.

FOREIGN PATENT DOCUMENTS

| JP | 2010-263158 A | 11/2010 |
| JP | 2014-074824 A | 4/2014 |
| WO | 2014/073138 A1 | 5/2014 |

* cited by examiner

IMAGE CAPTURING APPARATUS

TECHNICAL FIELD

The following disclosure relates to an image capturing apparatus that includes a polarizing filter.

BACKGROUND ART

Reflected light or scattered light that is generated by sunlight reflected or scattered by an object includes a polarized component resulting from a surface state of a reflection surface of the object. In recent years, as an image capturing apparatus that captures an image of a subject, development of an image capturing apparatus that separates a polarized component and an unpolarized component to enable correction of the captured image or deletion of unnecessary information related to the polarized component from the captured image has been advanced.

In a two-dimensional solid-state image capturing apparatus disclosed in PTL 1 cited below, a plurality of pixel areas are arranged in a two-dimensional matrix, each pixel area includes a plurality of sub-pixel areas, and a polarizing member of a slit type (wire grid type) is disposed at a light incident side of at least one of the sub-pixel areas. Each of the sub-pixel areas includes a wiring layer that controls an operation of a photoelectric conversion element, and the wiring layer is made of the same material as that of the polarizing member, and the wiring layer and the polarizing member are disposed on the same virtual plane.

PTL 1 describes that such a configuration makes it possible to optimize a positional relationship between the polarizing member of the slit type and the wiring layer.

CITATION LIST

Patent Literature

PTL 1: Japanese Unexamined Patent Application Publication No. 2010-263158 (published on Nov. 18, 2010)

SUMMARY OF INVENTION

Technical Problem

However, inventors of the present application (hereinafter, simply referred to as "inventors") examined the configuration of the related art described above and found that the configuration of the related art described above has such a problem of polarization characteristics that a transmittance of a polarized component that is not essentially desired to be transmitted is a few % to slightly less than 10% and is high. The polarized component that is not desired to be transmitted is a polarized component that has a polarized wave surface parallel to an extension direction of a slit and the polarizing member of the slit type has a filter function of reflecting and absorbing the polarized component.

Note that, the polarization characteristics that the configuration of the related art has will be specifically described later by comparing to polarization characteristics that a configuration of an embodiment of the present disclosure has.

An aspect of the disclosure is made in view of the problem found by the inventors and an object thereof is to realize an image capturing apparatus that includes a polarizing filter of a slit type in which polarization characteristics are improved.

Solution to Problem

In order to solve the aforementioned problem, an image capturing apparatus according to an aspect of the disclosure includes: an image sensor that includes a pixel provided with a polarizing unit, in which the pixel includes a wiring layer that controls an operation of the image sensor, the polarizing unit includes a plurality of polarizer layers and a dielectric layer that is arranged between two adjacent polarizer layers among the plurality of polarizer layers, a plurality of slits that are arranged at regular intervals in a predetermined direction are formed in each of the plurality of polarizer layers, and a forming material of each of the plurality of polarizer layers and a forming material of the wiring layer are selected from Al, Si, Cu, Au, Ag, Pt, W, Ti, Sn, In, Ga, Zn, and a compound or alloy that contains at least one of the foregoing.

Advantageous Effects of Invention

With an image capturing apparatus according to an aspect of the disclosure, an effect that polarization characteristics are able to be improved in an image capturing apparatus that includes a polarizing filter of a slit type is exerted.

DESCRIPTION OF EMBODIMENTS

Embodiment 1

Embodiment 1 of the disclosure will be described in detail below with reference to FIGS. 1 to 8. As described later, an image capturing apparatus 100 of the present embodiment is suitable for a polarization image capturing apparatus (polarization imaging camera).

(Outline of Image Capturing Apparatus 100)

Figure 2:
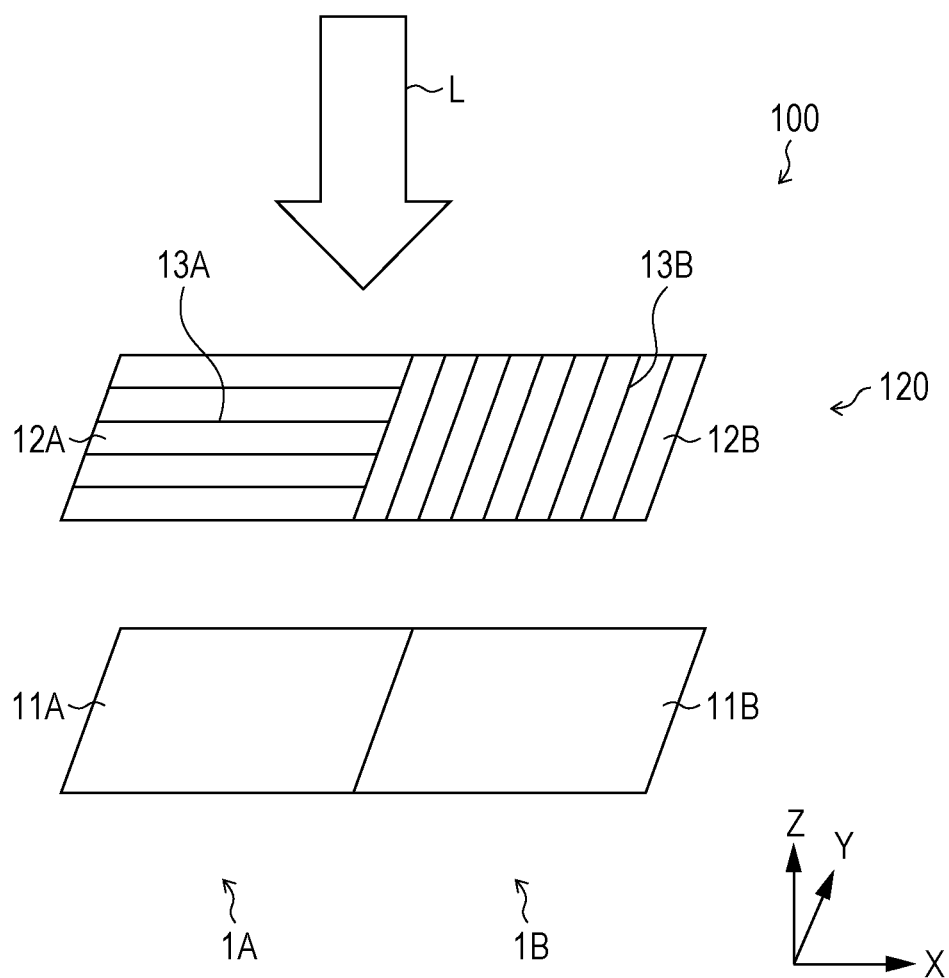
FIG. 2 is a schematic view for explaining a principle of an image sensor according to Embodiment 1 of the disclosure.

First, an outline of the image capturing apparatus 100 will be described with reference to FIG. 2. FIG. 2 is a schematic view for explaining a principle of the image capturing apparatus 100. In FIG. 2, two pixels 1A and 1B of the image capturing apparatus 100 are illustrated.

Here, a group of N pixels (proximate pixels) that are proximate in the image capturing apparatus 100 is referred to as a pixel unit. In FIG. 2, a pixel unit in a case of N=2 is illustrated for simplification. Note that, the pixels are formed on a substrate (for example, a substrate 15 of FIG. 1 described later) in the image capturing apparatus 100.

Each of the pixels in the pixel unit is provided with a light receiving unit (image sensor) and a polarizing unit (polarizer layer). As described later, the polarizing unit functions as a polarizing filter in the image capturing apparatus 100. Note that, all the pixels in the image capturing apparatus 100 do not need to include the polarizing unit. Moreover, a plurality of pixels may be arranged in one image sensor. Note that, it may be understood that one image sensor includes a pixel provided with the polarizing unit.

As described later, the light receiving unit and the polarizing unit are separated by a dielectric layer (flattened layer). Note that, the light receiving unit is a known photoelectric conversion element (image sensor), such as a CCD (Charge Coupled Device) or a CMOS (Complementary Metal Oxide Semiconductor), and description thereof will be omitted in the present embodiment.

In FIG. 2, the pixel 1A (one pixel in the pixel unit) is provided with a light receiving unit 11A and the pixel 1B (the other pixel in the pixel unit) is provided with a light receiving unit 11B. Each of the pixels 1A and 1B is provided with a polarizer layer 120 that is a layer forming the polarizing unit.

In the pixel 1A, the polarizer layer 120 is provided with a plurality of lattice portions 12A and a plurality of slits 13A. In the pixel 1B, the polarizer layer 120 is provided with a plurality of lattice portions 12B and a plurality of slits 13B. As illustrated in FIG. 2, the lattice portions 12A and the slits 13A extend in the same direction. The lattice portions 12B and the slits 13B also extend in the same direction (direction vertical to the direction in which the lattice portions 12A and the slits 13A extend).

Light L that is incident on the image capturing apparatus 100 from outside passes through the polarizer layer (polarizing unit) before reaching the light receiving unit. Hereinafter, a normal direction of the polarizer layer and the light receiving unit is referred to as a Z direction. The Z direction may be considered as a travel direction of the light L (imaging light) in an inside of the image capturing apparatus 100.

Here, the direction in which the slits 13A extend is set as an X direction and a direction in which the slits 13A are formed at regular intervals is set as a Y direction. Note that, the slits 13B extend in the Y direction and the slits 13B are formed at regular intervals in the X direction. The polarizing unit and the light receiving unit are formed on a plane (XY plane) vertical to the Z direction in an XYZ orthogonal coordinate system of FIG. 2.

As described above, slits that extend in the same direction as that of lattice portions are provided in the polarizer layer of each of the proximate pixels of the pixel unit. Generally, in the pixel unit constituted by N proximate pixels, an angle of an extension direction of slits varies by (180°/N). Thus, in a case where one pixel is set as a reference pixel (that is, in a case where an angle of an extension direction of slits in one pixel is set as 0° (reference angle)), angles of extension directions of slits in the N pixels are represented as "0°", "180°/N", "(180°/N)×2" . . . , and "(180°/N)×(N−1)". Note that, the configuration of FIG. 2 described above corresponds to a case of N=2.

The polarizer layer (more specifically, lattice portions and slits) (i) transmits a polarized component in a direction vertical to the direction in which the slits extend and (ii) does not transmit (but reflects or absorbs) a polarized component in a direction parallel to the direction in which the slits extend, out of light incident on the polarizer layer.

Thus, the polarizer layer 120 (more specifically, the lattice portions 12A and the slits 13A) in the pixel A transmits a polarized component of the light L in the Y direction and causes the polarized component to be incident on the light receiving unit 11A. On the other hand, the polarizer layer 120 in the pixel A blocks a polarized component of the light L in the X direction and does not cause the polarized component to be incident on the light receiving unit 11A.

The polarizer layer 120 (more specifically, the lattice portions 12B and the slits 13B) in the pixel B transmits a polarized component of the light L in the X direction and causes the polarized component to be incident on the light receiving unit 11B. On the other hand, the polarizer layer 120 in the pixel B blocks a polarized component of the light L in the Y direction and does not cause the polarized component to be incident on the light receiving unit 11B.

In this manner, the polarizer layer 120 is provided in each of the pixels 1A and 1B, so that different polarized components of the light L are able to be incident on the light receiving units 11A and 11B. Further, when an electric signal (photoelectric current) obtained as a result of photoelectric conversion in each of the light receiving units 11A and 11B is converted into a luminance value, polarization information of the light L is able to be obtained.

Meanwhile, in order to obtain polarization information of the light L in a normal image capturing apparatus, it is necessary to provide a linear polarizer on a front surface of the image capturing apparatus and perform image capturing multiple times by rotating the linear polarizer. On the other hand, with the image capturing apparatus 100, the polarization information of the light L is able to be obtained by performing image capturing once. Thus, with the image capturing apparatus 100, it is possible to obtain the polarization information at a higher speed and more easily than a conventional image capturing apparatus.

The image capturing apparatus 100 may further include an information processing unit (not illustrated) that performs predetermined processing by using the polarization information. As an example, the information processing unit may perform processing for separating a specular reflection component and a diffusion reflection component of light by using the polarization information. The processing makes it possible to improve measurement accuracy when a shape of an object is optically measured. It is also possible to improve, when an image of a scenery (scenery of fog, underwater, or the like) that includes much polarized light is captured, quality of the captured image.

(Specific Configuration of Pixel 1)

Next, a specific configuration of a pixel in the image capturing apparatus 100 will be described. The description will be given by exemplifying the pixel 1A described above, as an example. In the following description, the pixel 1A is referred to as a pixel 1 for simplification of a name of a member. Furthermore, the light receiving unit 11A, the lattice portions 12A, and the slits 13A are respectively referred to as a light receiving unit 11 (image sensor), lattice portions 12, and slits 13.

Figure 1:
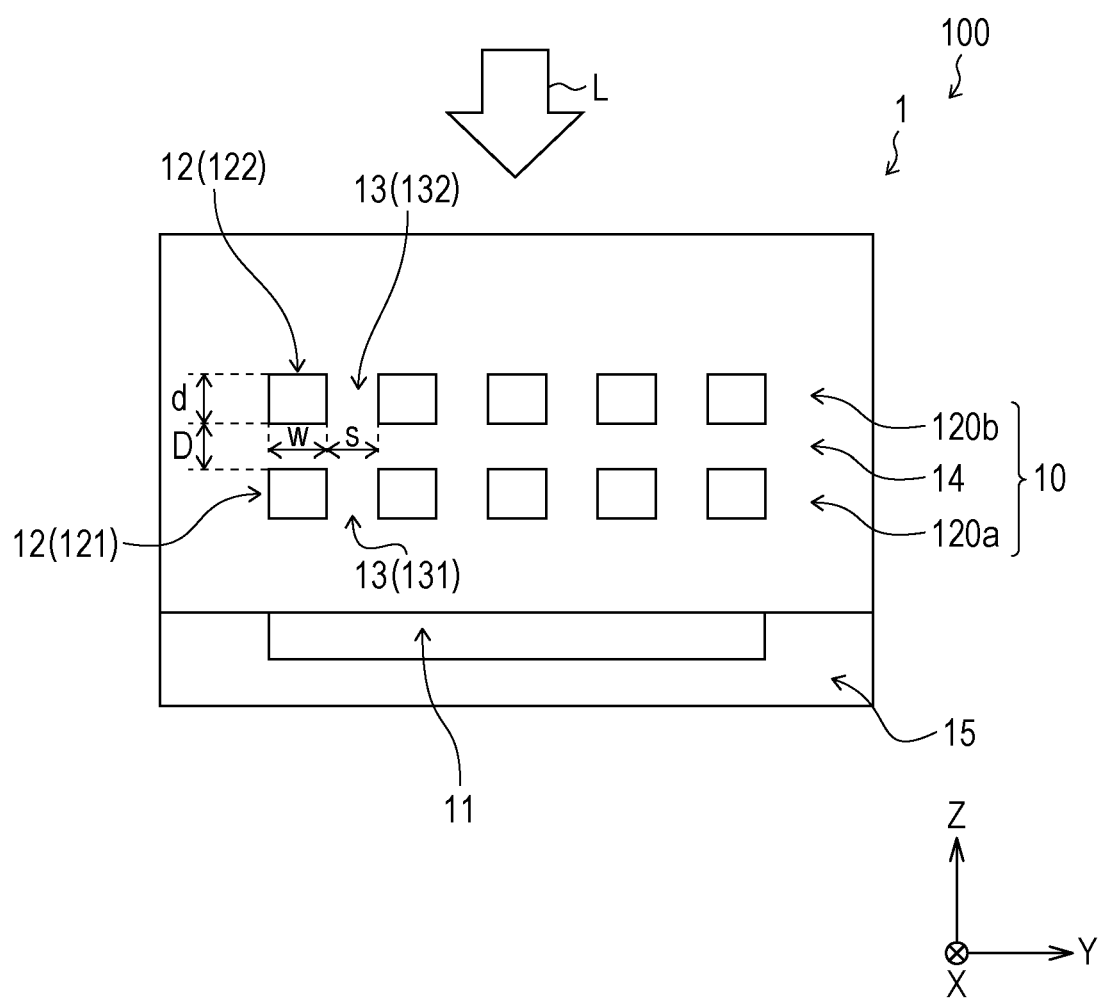
FIG. 1 is a sectional view illustrating a configuration of a main part of a pixel according to Embodiment 1 of the disclosure.

FIG. 1 is a sectional view illustrating a configuration of a main part of the pixel 1. In FIG. 1, a sectional view taken along a YZ plane is illustrated. The pixel 1 is formed on the substrate 15 that is, for example, a silicon substrate. As illustrated in FIG. 1, the pixel 1 includes the polarizing unit 10 and the light receiving unit 11.

The polarizing unit 10 is formed correspondingly to one pixel 1 of a plurality of pixels of the image capturing apparatus 100. The polarizing unit 10 includes a first polarizer layer 120a (polarizer layer), a second polarizer layer 120b (polarizer layer), and a dielectric layer 14 (also referred to as a flattened layer). Note that, the first polarizer layer 120a and the second polarizer layer 120b are parallel to each other and both of them have a normal direction in the Z direction.

As illustrated in FIG. 1, the first polarizer layer 120a and the second polarizer layer 120b are separated by the dielectric layer 14 in the Z direction. Thus, the first polarizer layer 120a and the second polarizer layer 120b are provided at different positions in the Z direction (two positions in the Z direction). Here, the first polarizer layer 120a is a polarizer layer closer to the light receiving unit 11. The second polarizer layer 120b is a polarizer layer farther from the light receiving unit 11.

Note that, a case where the number of polarizer layers provided in the pixel 1 is two is exemplified in FIG. 1 for simplification, but the number may be three or more. That is, the number of polarizer layers in the pixel 1 is only required to be multiple.

The lattice portions 12 and the slits 13 described above are provided in each of the first polarizer layer 120a and the second polarizer layer 120b. In the pixel 1, the lattice portions 12 and the slits 13 are arranged at regular intervals in the Y direction (predetermined direction) (also refer to the lattice portions 12A and the slits 13A of FIG. 2 described above).

Hereinafter, a lattice portion 12 and a slit 13 in the first polarizer layer 120a are also referred to as a lattice portion 121 and a slit 131, respectively. A lattice portion 12 and a slit 13 in the second polarizer layer 120b are also referred to as a lattice portion 122 and a slit 132, respectively. As illustrated in FIG. 1, in the pixel 1, the lattice portion 121 (slit 131) is arranged so as to overlap with the lattice portion 122 (slit 132) to a maximum degree as viewed from the Z direction.

A material of each of the polarizer layers (the first polarizer layer 120a and the second polarizer layer 120b) may be similar to that of a wiring layer 19 (refer to FIG. 4 described later) of the image capturing apparatus 100 or may be different from that of the wiring layer 19.

Specifically, each of the material (forming material) of the polarizer layer and the material (forming material) of the wiring layer 19 may be a material selected from Al, Si, Cu, Au, Ag, Pt, W, Ti, Sn, In, Ga, Zn, and a compound or alloy that contains at least one of the foregoing. As a combination of the material of the polarizer layer and the material of the wiring layer 19, a combination that improves polarization characteristics of the pixel 1 as much as possible is preferably selected. Note that, the polarizer layer may be formed by extending the wiring layer 19.

Here, a thickness (a length in the Z axis direction, in other words, a thickness of the polarizer layer) of the lattice portion 12 is represented as d. Note that, a thickness of the lattice portion 121 and a thickness of the lattice portion 122 may be the same or different. In the present embodiment, for simplification, it is assumed that the lattice portions 121 and 122 have the same thickness. An interval (an interval of lattice portions adjacent in the Z direction, in other words, a thickness of the dielectric layer 14 disposed between the lattice portions 121 and 122) between the lattice portion 121 and the lattice portion 122 in the Z direction is represented as D.

Figure 13:
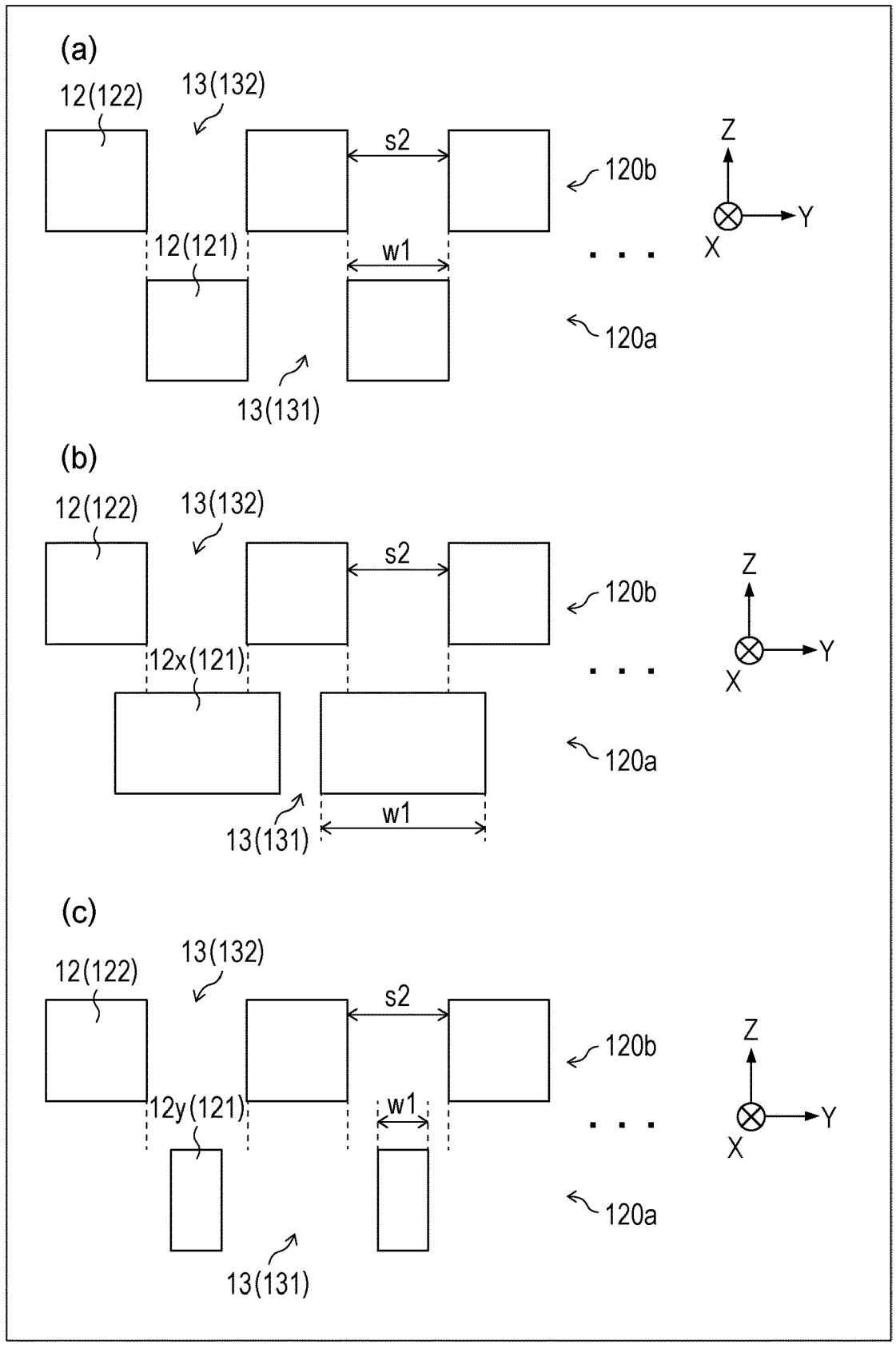
FIGS. 13(a) to (c) illustrate variations in which a polarizing unit is arranged in the pixel according to Embodiment 2 of the disclosure.

A length of the lattice portion 12 in the Y direction is represented as a width w. A length of the slit 13 in the Y direction is represented as a slit width s. The slit width s is equal to the interval between lattice portions 12 adjacent in the Y direction. In the present embodiment, it is assumed that w is equal to s for simplification. However, w may not be equal to s. In the present embodiment, it is assumed that the width w and the slit width s are the same in both of the first polarizer layer 120a and the second polarizer layer 120b, but values thereof may be different between the first polarizer layer 120a and the second polarizer layer 120b (also refer to FIG. 13 described later).

Figure 3:
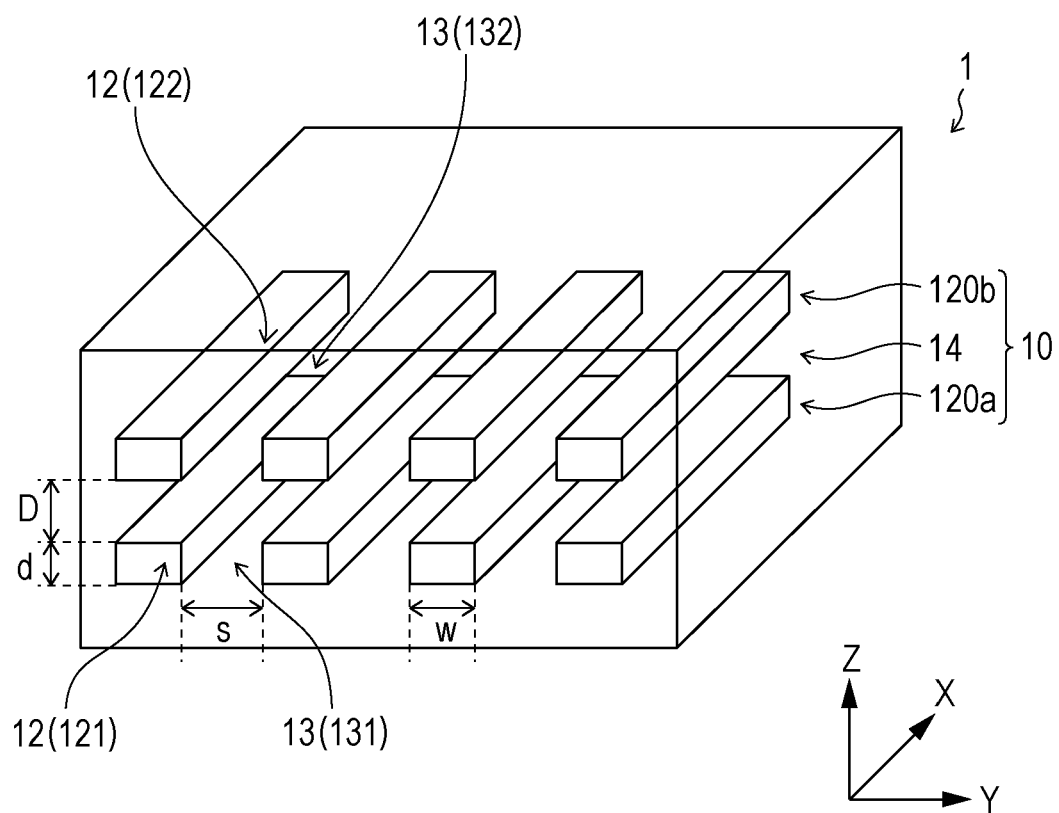
FIG. 3 is a perspective view schematically illustrating a state where lattice portions are included in a dielectric layer in the pixel according to Embodiment 1 of the disclosure.

The dielectric layer 14 is a layer disposed between the first polarizer layer 120a and the second polarizer layer 120b and includes the lattice portions 12. A part of the dielectric layer 14 exists also in the slits 13. A material of the dielectric layer 14 is formed of a dielectric material such as a silicon oxide film or a silicon nitride film. FIG. 3 is a perspective view schematically illustrating a state where the lattice portions 12 are included in the dielectric layer 14.

Note that, an example of a method of manufacturing the image capturing apparatus 100 of FIG. 1 is as follows. That is, the light receiving unit 11 (example: photodiode) that converts incident light into an electric signal is formed on the substrate 15 (example: silicon substrate) by a general semiconductor process and the dielectric layer 14 is formed on the substrate 15 by a CVD (Chemical Vapor Deposition) method.

Subsequently, after forming a polarizer layer (example: first polarizer layer 120a) by sputtering, the polarizer layer is subjected to patterning by using a photolithography method, and the lattice portions 12 and the slits 13 are thereby formed. Next, the dielectric layer 14 is formed so as to be on the polarizer layer and fill the slits 13 by the CVD method. When needed, polishing is performed, for example, by CMP (Chemical Mechanical Polishing) or the like so that the dielectric layer 14 becomes flat. By performing a series of steps described above multiple times, the image capturing apparatus 100 including a plurality of polarizer layers (example: the first polarizer layer 120a and the second polarizer layer 120b) is formed.

Figure 4:
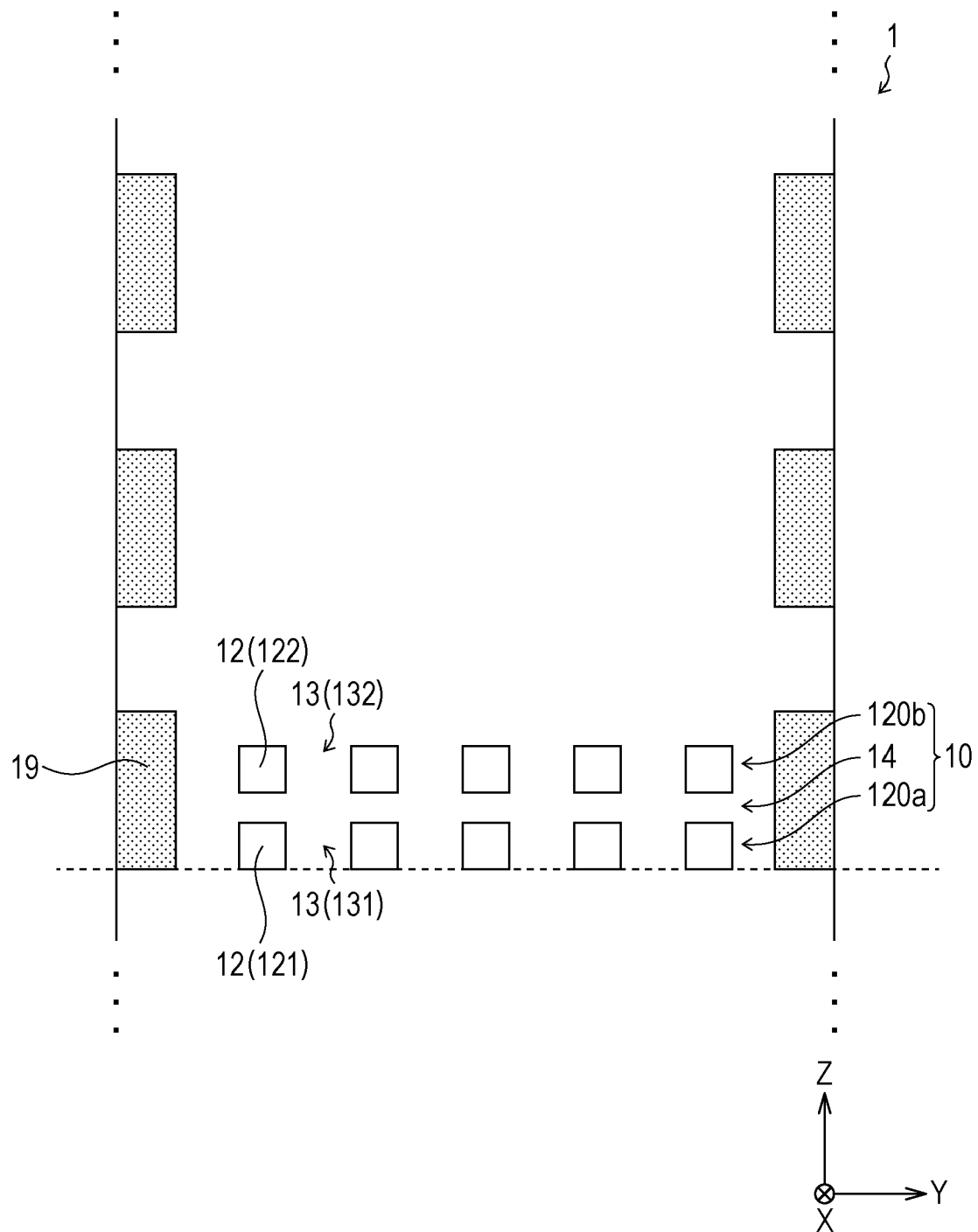
FIG. 4 is a sectional view schematically illustrating a positional relationship between a wiring layer, a first polarizer layer, and a second polarizer layer in the pixel according to Embodiment 1 of the disclosure.

FIG. 4 is a sectional view schematically illustrating a positional relationship between the wiring layer 19, the first polarizer layer 120a, and the second polarizer layer 120b that are described above. The wiring layer 19 controls an operation of the image capturing apparatus 100 (in particular, light receiving unit 11) and is provided in each pixel 1.

As illustrated in FIG. 4, a plurality of wiring layers 19 are provided to be separated from each other in the Z direction. Note that, after one wiring layer 19 is formed, at least one of the plurality of polarizer layers may be formed on the same layer as the wiring layer 19. In such a case, the at least one of the plurality of polarizer layers constitutes the same layer as the wiring layer 19. FIG. 4 exemplifies a case where the first polarizer layer 120a constitutes the same layer as the wiring layer 19.

When at least one of the plurality of polarizer layers constitutes the same layer as the wiring layer 19, the polarizer layer is able to be formed during a manufacturing process of the image capturing apparatus 100. Thus, a step of combining a polarizing unit (polarizing filter) and an image sensor (light receiving unit) is not required and it is possible to accurately position the polarizing unit and a pixel of the image sensor. Further, manufacturing of the polarizer layers is facilitated.

However, the plurality of polarizer layers may not necessarily constitute the same layer as the wiring layer 19 in the image capturing apparatus 100.

(Evaluation of Polarization Characteristics of Pixel 1)

Figure 5:
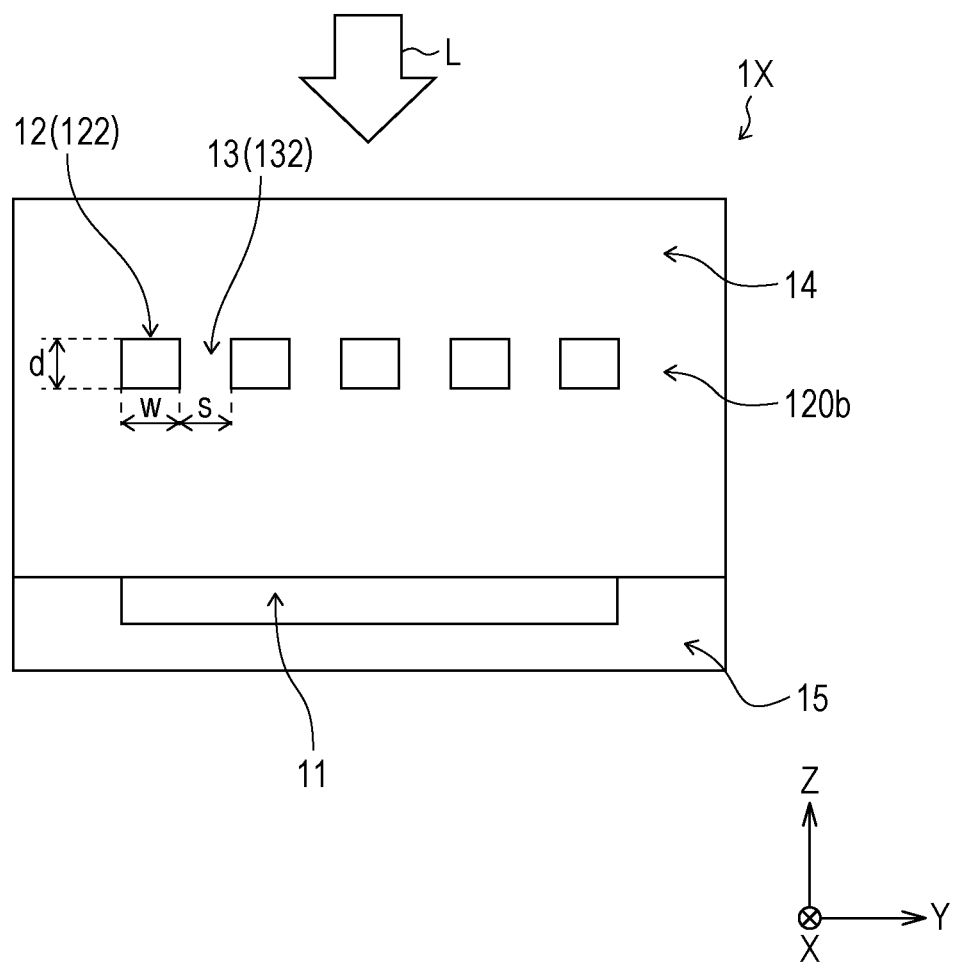
FIG. 5 is a sectional view illustrating a configuration of a main part of a pixel as a comparative example of the pixel according to Embodiment 1 of the disclosure.
Figure 6:
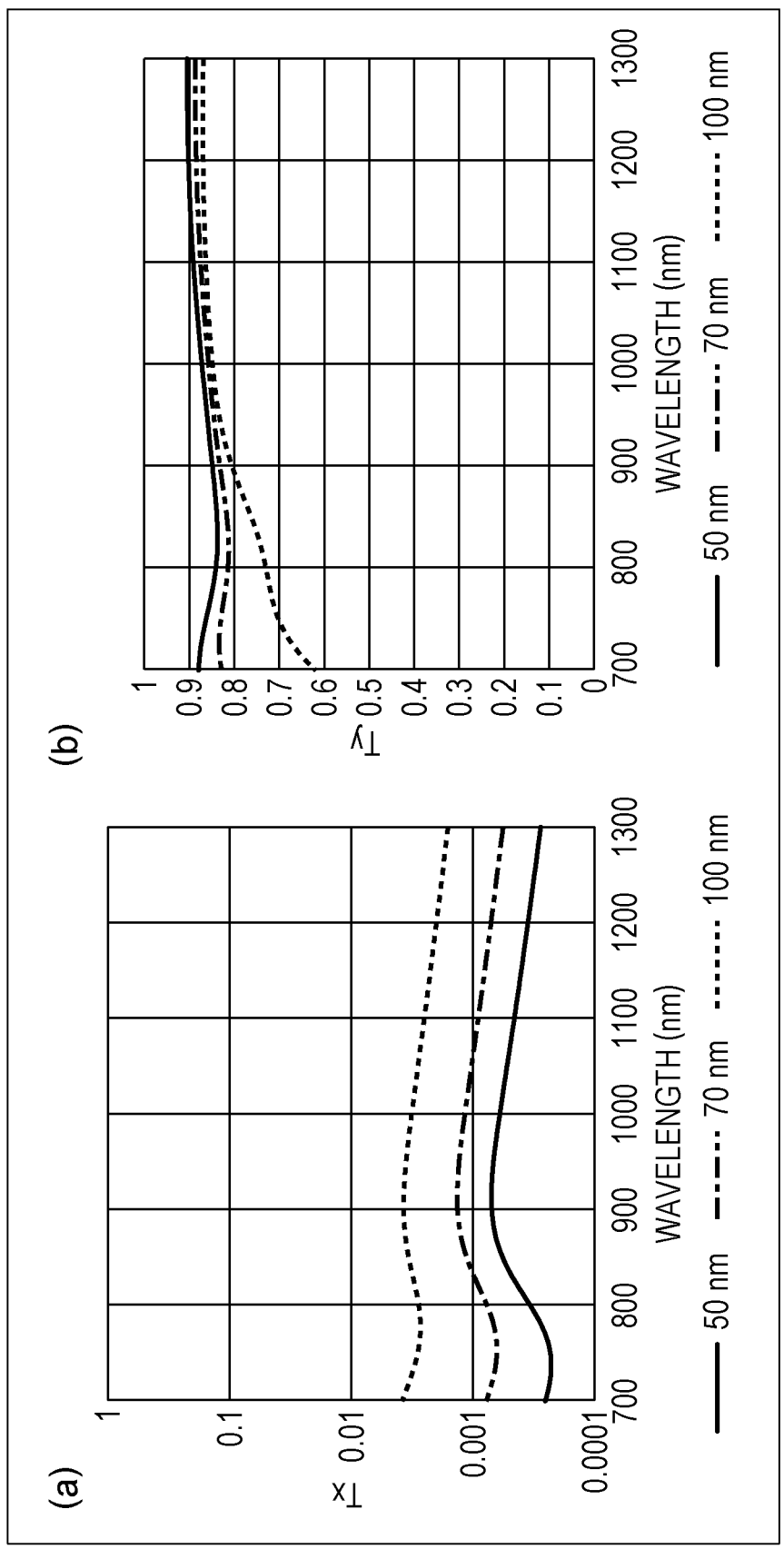
FIG. 6(*a*) illustrates a relationship between a wavelength of light and a transmittance Tx in the pixel according to Embodiment 1 of the disclosure and FIG. 6(*b*) illustrates a relationship between the wavelength of light and a transmittance Ty in the pixel.

Next, an evaluation result of the polarization characteristics of the pixel 1 will be described. Here, a pixel 1X as a comparative example is considered for comparative evaluation of the polarization characteristics of the pixel 1. FIG. 5 is a sectional view illustrating a configuration of a main part of the pixel 1X.

The pixel 1X has a configuration obtained by omitting the first polarizer layer 120a from the pixel 1 of the present embodiment. That is, the pixel 1X is different from the pixel 1 in that the number of polarizer layers is not multiple but one. The configuration of the related art described above is simulated as the configuration of the pixel 1X.

First, the inventors evaluated polarization characteristics of the pixel 1X by computer simulation using an FDTD (Finite difference time domain) method. Conditions used for the simulation are indicated as (A1) to (A5) below.

<Simulation Conditions of Pixel 1X>
(A1) Material of second polarizer layer 120b: Al;
(A2) Material of dielectric layer 14: $SiO_2$;
(A3) Thickness d=40 nm;
(A4) Width w=50 nm, 70 nm, 100 nm (three widths); and
(A5) Slit width s=the same as width w of (A4) above.

As a result of the simulation, a transmittance (hereinafter, referred to as Tx) of a polarized component in the X direction and a transmittance (hereinafter, referred to as Ty) of a polarized component in the Y direction were calculated in the pixel 1X.

Figure 7:
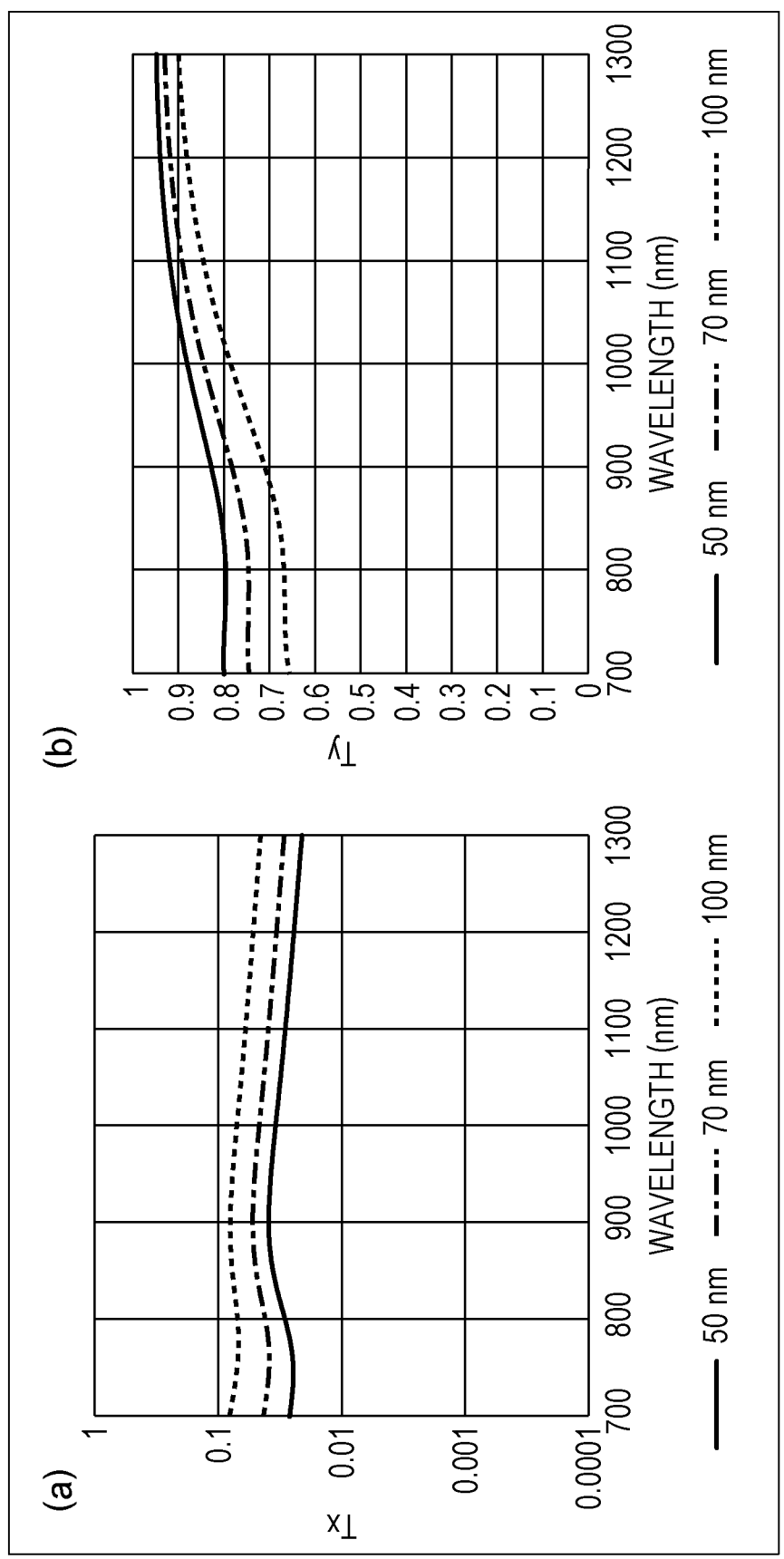
FIG. 7(*a*) illustrates a relationship between the wavelength of light and the transmittance Tx in the pixel as the comparative example and FIG. 7(*b*) illustrates a relationship between the wavelength of light and the transmittance Ty in the pixel.

FIG. 7(a) is a graph illustrating a relationship between a wavelength of light and the transmittance Tx in the pixel 1X. FIG. 7(b) is a graph illustrating a relationship between the wavelength of light and the transmittance Ty in the pixel 1X. Note that, a horizontal axis indicates the wavelength of light and a vertical axis indicates the transmittance in FIG. 7.

Here, the pixel 1X is a pixel corresponding to the pixel 1A of FIG. 2 described above, similarly to the pixel 1 described above. Thus, the pixel 1X is configured to block the polarized component of light in the X direction (extension direction of the slits 13) and transmit the polarized component of the light in the Y direction (direction vertical to the X direction). In other words, the pixel 1X is configured so that the transmittance Tx is sufficiently smaller than the transmittance Ty. Such a relationship between the transmittances Tx and Ty is understood also from the graphs of FIG. 7.

Next, the inventors evaluated the polarization characteristics of the pixel 1 as well by similar simulation. Conditions used for the simulation are indicated as (B1) to (B6) below.

<Simulation Conditions of Pixel 1>
(B1) Materials of first polarizer layer 120a and second polarizer layer 120b: Al;
(B2) Material of dielectric layer 14: $SiO_2$;
(B3) Thickness d=40 nm;
(B4) Width w=50 nm, 70 nm, 100 nm (three widths);
(B5) Slit width s=the same as width w of (4) above, and
(B6) interval D=50 nm.

As a result of the simulation, the transmittances Tx and Ty were calculated also in the pixel 1. FIG. 6(a) is a graph illustrating a relationship between the wavelength of light and the transmittance Tx in the pixel 1 and FIG. 6(b) is a graph illustrating a relationship between the wavelength of light and the transmittance Ty in the pixel 1.

When FIG. 6(b) and FIG. 7(b) were compared, there was no notable difference of the transmittance Ty between the pixel 1 and the pixel 1X. That is, the polarized component of light in the Y direction was sufficiently transmitted in both of the pixel 1 and the pixel 1X.

On the other hand, when FIG. 6(a) and FIG. 7(a) were compared, it was found that the transmittance Tx in the pixel 1 was significantly reduced compared to that in the pixel 1X. That is, it was found that the polarized component (polarized component to be blocked) in the X direction was blocked more effectively in the pixel 1 compared to that in the pixel 1X. That is, it was found that the polarized component in the X direction, which was difficult to be sufficiently blocked in a conventional pixel, was able to be blocked more reliably in the pixel 1.

The inventors also performed comparison of an extinction ratio R in order to indicate a difference of the polarization characteristics between the pixel 1 and the pixel 1X more specifically. Here, the extinction ratio R is represented as R=Ty/Tx. The extinction ratio R is an index indicating a proportion of the polarized component (polarized component to be transmitted) in the Y direction to the polarized component (polarized component to be blocked) in the X direction. Thus, it may be said that polarization characteristics (performance of a polarizing filter) of a pixel are excellent as the extinction ratio R increases.

Figure 8:
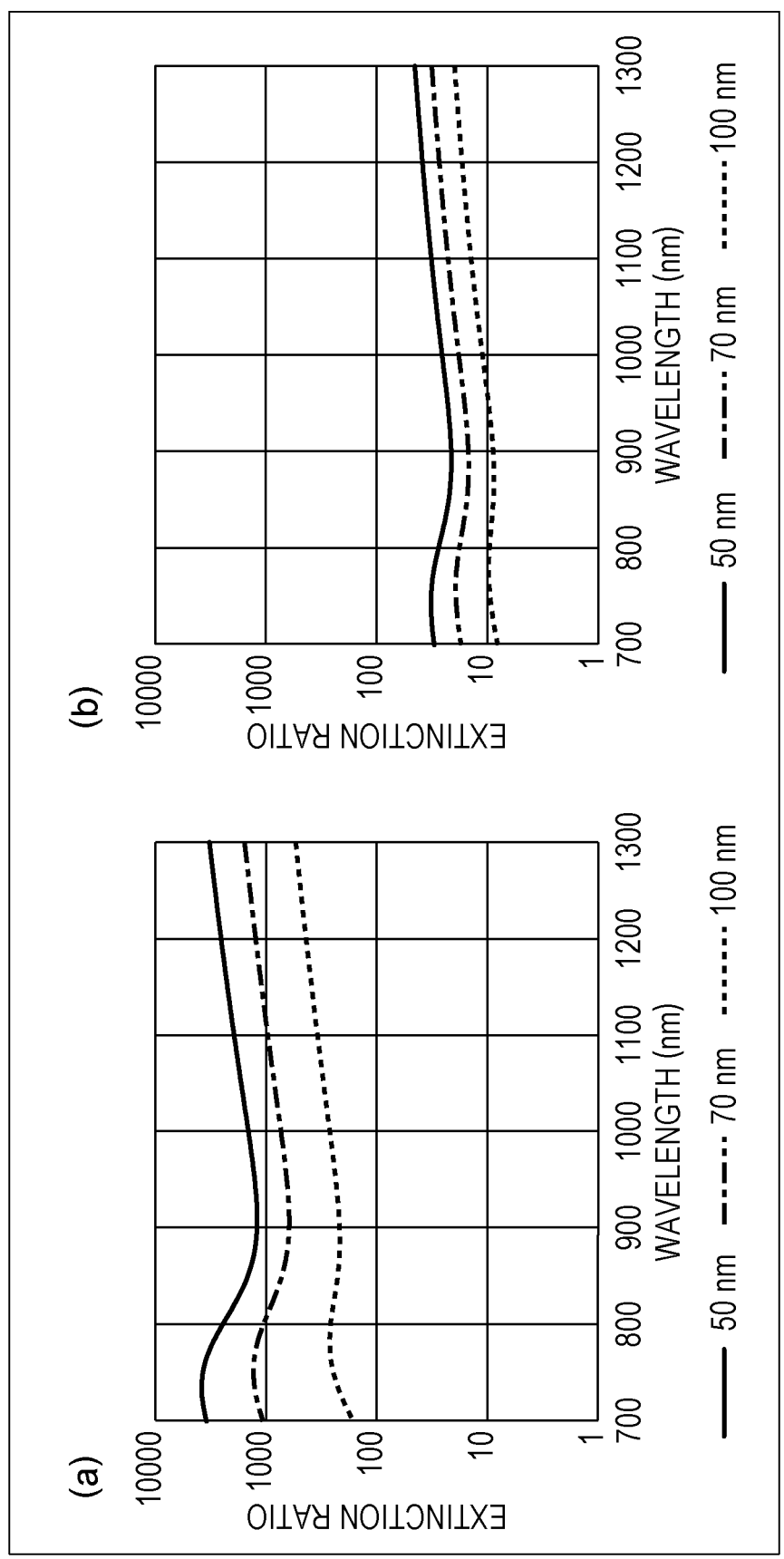
FIG. 8(*a*) illustrates a relationship between the wavelength of light and an extinction ratio in the pixel according to Embodiment 1 of the disclosure and FIG. 8(*b*) illustrates a relationship between the wavelength of light and the extinction ratio in the pixel as the comparative example.

FIGS. 8(a) and 8(b) are graphs indicating a relationship between the wavelength of light and the extinction ratio R in the pixel 1 and the pixel 1X, respectively. The inventors found that the extinction ratio R of the pixel 1 was much higher than that of the pixel 1X, as illustrated in FIG. 8.

It was also found that, in a wavelength region where the wavelength of light is 700 nm or more, the extinction ratios of the pixel 1 and the pixel 1X were improved as the width w (and the slit width s) described above was reduced.

(Effect of Image Capturing Apparatus 100)

As described above, the inventors newly found that, with the configuration of the pixel 1 (that is, by providing a plurality of polarizer layers at different positions in the Z direction), the image capturing apparatus 100 with more excellent polarization characteristics than a conventional image capturing apparatus was able to be realized. Therefore, by applying the pixel 1, it is possible to realize the image capturing apparatus 100 capable of acquiring more accurate polarization information than a conventional image capturing apparatus.

Additionally, it was found that an excellent extinction ratio was achieved in "a case of w=100 nm in the pixel 1" (configuration where the extinction ratio is the lowest in the pixel 1) compared to "a case of w=50 nm in the pixel 1X" (configuration where the extinction ratio is the highest in the pixel 1X), as illustrated in FIG. 8 described above.

Note that, a positional relationship between the lattice portion 121 and the lattice portion 122 is set in the pixel 1 so that the lattice portion 122 and the lattice portion 121 overlap with each other to a maximum degree. In such setting, (i) a first plane passing through a center of the lattice portion 121 so as to be parallel to the Z direction (normal direction of each of the first polarizer layer 120a and the second polarizer layer 120b) and (ii) a second plane passing through a center of the lattice portion 122 so as to be parallel to the Z direction may be the same plane.

In this case, the positional relationship between the lattice portion 121 and the lattice portion 122 with respect to the normal direction of the second polarizer layer 120b is not limited thereto. As described in Embodiment 2 below, various kinds of setting are allowed for the positional relationship.

Embodiment 2

Embodiment 2 of the disclosure will be described as follows with reference to FIGS. 9 to 13. Note that, for convenience of description, a member having the same function as that of the member described in the foregoing embodiment is given the same reference sign and description thereof will be omitted.

(Configuration of Pixel 2)

Figure 9:
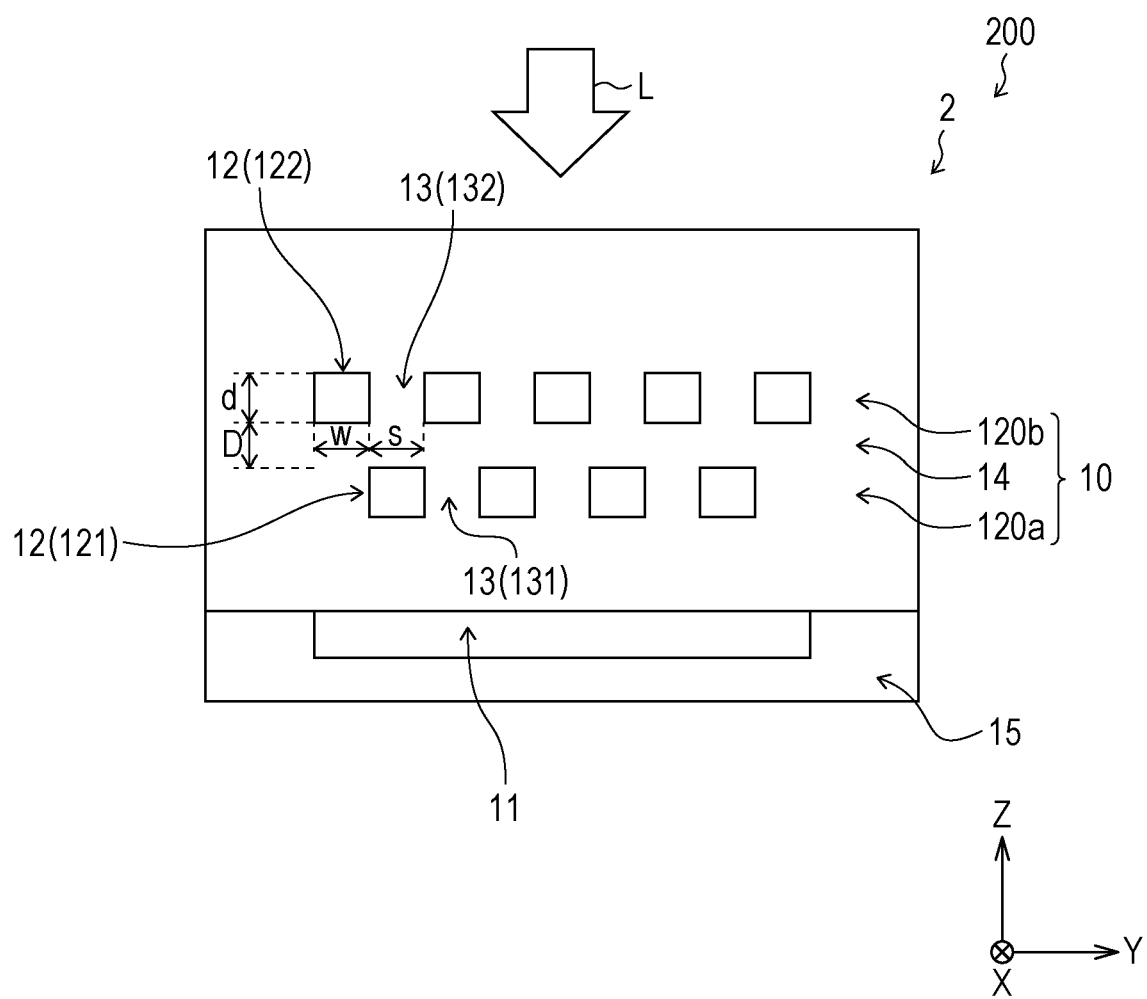
FIG. 9 is a sectional view illustrating a configuration of a main part of a pixel according to Embodiment 2 of the disclosure.
Figure 10:
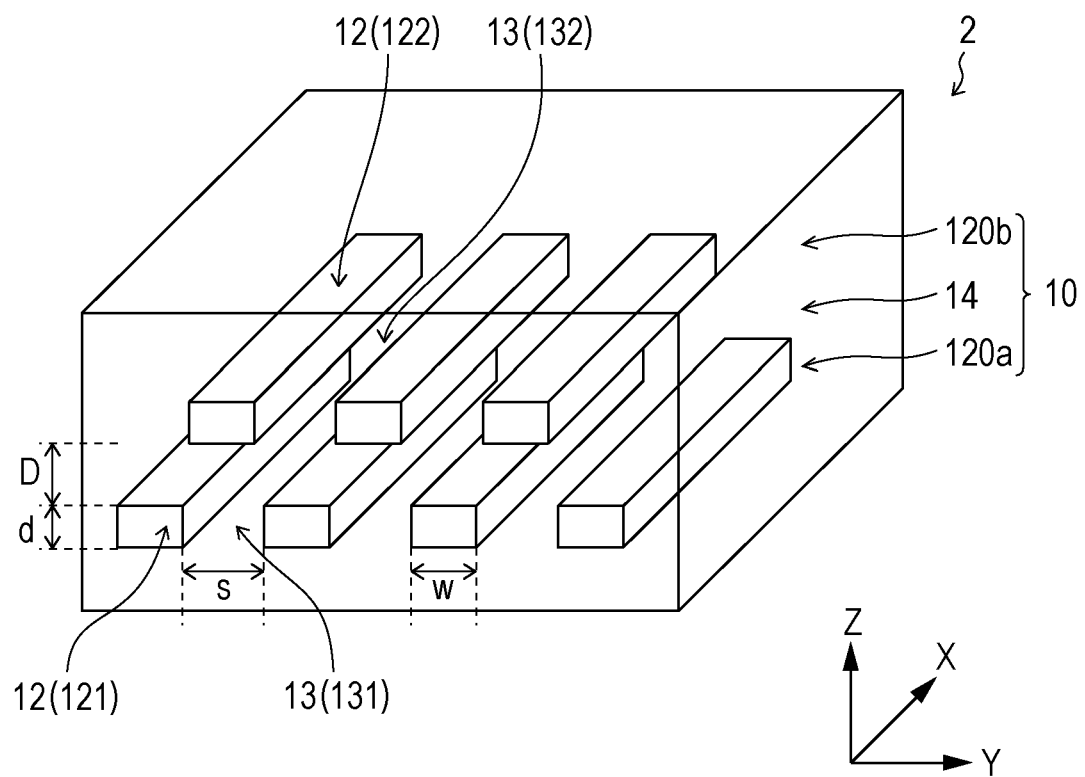
FIG. 10 is a perspective view schematically illustrating a state where the lattice portions are included in the dielectric layer in the pixel according to Embodiment 2 of the disclosure.

FIG. 9 is a sectional view illustrating a configuration of a main part of a pixel 2 of the present embodiment. Note that, for distinction from the image capturing apparatus 100 of Embodiment 1 described above, an image capturing apparatus (image capturing apparatus of the present embodiment) including the pixel 2 is referred to as an image capturing apparatus 200. FIG. 10 is a perspective view similar to FIG. 3 described above.

The configuration of the pixel 2 of the present embodiment is different from the pixel 1 of Embodiment 1 only in that a slit 131 (lattice portion 121) and a slit 132 (lattice portion 122) are arranged so as not to (substantially) overlap with each other as viewed from the Z direction.

That is, in the pixel 2, a slit width s of the slit 132 and a width w of the lattice portion 121 are set to be equal and the slit 132 and the lattice portion 121 overlap with each other substantially without a gap as viewed from the Z direction.

Note that, "overlapping with each other substantially without a gap" means including a portion where a gap is generated in overlapping of the slit 132 and the lattice portion 121 or including a case where the gap is generated in the overlapping, due to a manufacturing error (manufacturing tolerance) of the image capturing apparatus 200. Note that, a manufacturing tolerance of the width w may be in a range of about ±20% of a designed value.

(Evaluation of Polarization Characteristics of Pixel 2)

Next, an evaluation result of polarization characteristics of the pixel 2 will be described. First, for comparative evaluation of the polarization characteristics of the pixel 2, the inventors performed evaluation again for the polarization characteristics of the pixel 1X of FIG. 5 described above by changing a part of the simulation conditions. Specifically, the inventors evaluated the polarization characteristics of the pixel 1X by changing the condition (A4) described above to the following (C4).

<Simulation Condition of Pixel 1X>

(C4): Width w=50 nm, 70 nm, 100 nm, 150 nm, 200 nm (five widths).

Note that, the conditions (A1) to (A3) and (A5) described above are similar to those in Embodiment 1. Thus, the slit width s is the same as the width w of (C4) described above.

Subsequently, the inventors evaluated the polarization characteristics of the pixel 2 as well. Specifically, the inventors evaluated the polarization characteristics of the pixel 2 by changing the condition (B4) described above to the following (D4).

<Simulation Condition of Pixel 2>

(D4): Width w=50 nm, 70 nm, 100 nm, 150 nm, 200 nm (five widths).

Note that, the conditions (B1) to (B3), (B5), and (B6) described above are similar to those in Embodiment 1. Thus, the slit width s is the same as the width w of (D4) described above.

Then, as a result of the simulation, the extinction ratios R in the pixel 1X and the pixel 2 were calculated similarly to Embodiment 1 described above. FIGS. 11(a) and (b) are graphs indicating a relationship between a wavelength of light and the extinction ratio R in the pixel 2 and the pixel 1X, respectively.

Figure 11:
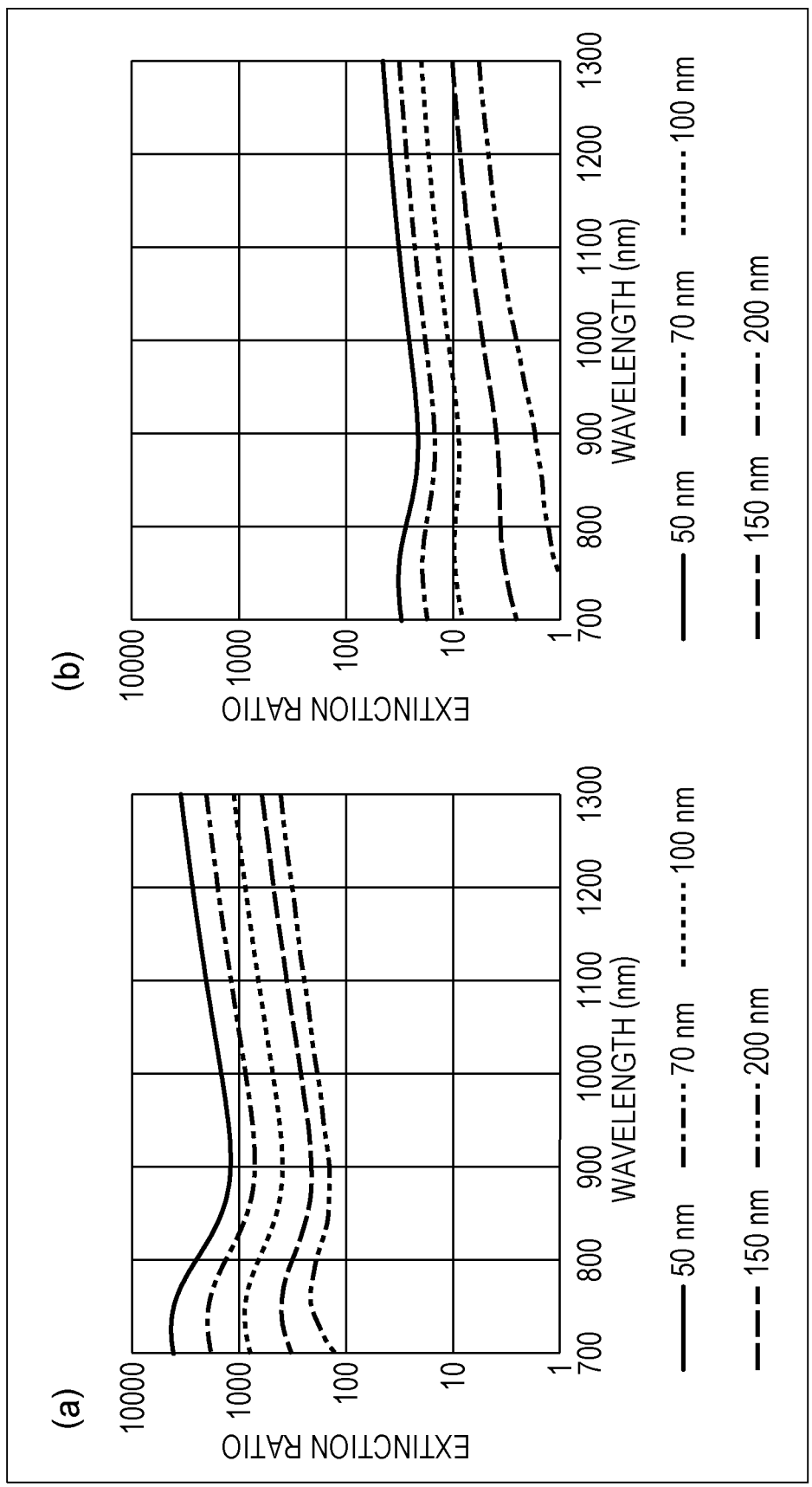
FIG. 11(*a*) illustrates a relationship between the wavelength of light and the extinction ratio in the pixel according to Embodiment 2 of the disclosure and FIG. 11(*b*) illustrates a relationship between the wavelength of light and the extinction ratio in the pixel as the comparative example.

The inventors found that the extinction ratio R of the pixel 2 was also much higher than that of the pixel 1X, as illustrated in FIG. 11. It was also found that, in a wavelength region where the wavelength of light is 700 nm or more, the extinction ratios of the pixel 2 and the pixel 1X were improved as the width w (and the slit width s) described above was reduced, similarly to Embodiment 1.

Additionally, it was found that an excellent extinction ratio was achieved in "a case of w=200 nm in the pixel 2" (configuration where the extinction ratio is the lowest in the pixel 2) compared to "a case of w=50 nm in the pixel 1X" (configuration where the extinction ratio is the highest in the pixel 1X), as illustrated in FIG. 11.

In this manner, still excellent polarization characteristics are obtained in the pixel 2 even when the width w is made sufficiently wider than that of the pixel 1X (conventional pixel). Thereby, the following two advantages are obtained. Note that, similar advantages are obtained also in the pixel 1 of Embodiment 1 described above.

(Advantage 1): Since the width w is able to be made wider, the lattice portion 12 is able to be formed easily by a conventional wiring process apparatus (example: process apparatus for 200 nm). That is, the lattice portion 12 is able to be formed without requiring a special fine process apparatus, so that a manufacturing cost of the image capturing apparatus 200 is able to be reduced.

(Advantage 2): Meanwhile, in a general metal wire, it is known that, when a width of the wire is reduced, a void or disconnection in a slit shape is easily generated due to stress migration while the wire is formed.

The stress migration is a phenomenon that stress is caused in a metal wire mainly due to a difference of coefficients of thermal expansion between (i) the metal wire and (ii) an insulating film, such as oxide or nitride, which surrounds the metal wire. When the metal wire becomes unable to endure the stress, a void or disconnection in a slit shape is generated in the metal wire itself.

It is known that the stress migration greatly depends on a width of the metal wire. A lifetime of the metal wire depends on a probability of disconnection of the metal wire. It is known that the lifetime of the metal wire exhibits exponential dependency on the width of the metal wire.

In a pixel (image capturing apparatus) according to an aspect of the disclosure, similarly to the general metal wire, stress migration that depends on the width w may be caused in a lattice portion (lattice portion 12) surrounded by a dielectric layer (dielectric layer 14).

In a pixel (image capturing apparatus) according to an aspect of the disclosure, stress is caused in a lattice portion as a result of a difference of coefficients of thermal expansion between (i) a material forming the lattice portion and (ii) a material forming a dielectric layer. Due to the stress, similarly to the general metal wire, a so-called void or disconnection in a slit shape may be generated in the lattice portion.

Figure 12:
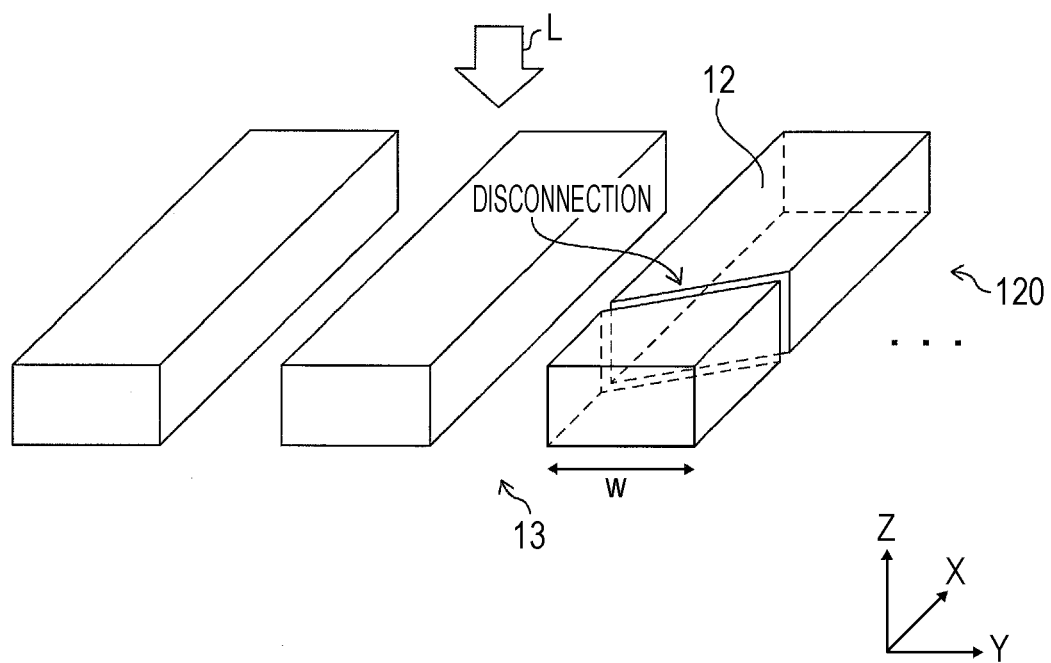
FIG. 12 is a view for explaining stress migration in a pixel according to an aspect of the disclosure.

FIG. 12 is a view for explaining stress migration in a pixel according to an aspect of the disclosure. As illustrated in FIG. 12, for example, in a case where a void or disconnection in a slit shape is generated in the lattice portion 12 that extends in the X direction, the lattice portion 12 is completely or partially divided by the disconnection. A divided surface of the lattice portion 12 by the disconnection is also referred to as a disconnection surface.

The disconnection described above has a shape (so-called slit shape) with a predetermined width (example: width of several nm to several tens of nm) in the X direction. In a case where the slit shape is formed, the extinction ratio is deteriorated in the pixel according to the aspect of the disclosure. This is because, due to existence of the slit shape, a polarized component (a component having a polarized wave surface parallel to an extension direction of a slit of the pixel, a component to be essentially blocked in the lattice portion 12) in the X direction is transmitted in the lattice portion 12.

Therefore, in a case where the width w of the lattice portion 12 is reduced for the purpose of improving the extinction ratio, it is concerned that a void or disconnection in a slit shape is generated in the lattice portion 12 and the polarization characteristics of the pixel 2 are degraded.

However, since the width w is able to be increased in the pixel 2, it is possible to prevent the void or the disconnection in the slit shape from being generated when the lattice portion 12 is formed. Thus, it is possible to prevent degradation of the polarization characteristics of the pixel 2 due to the generation of the void or the disconnection in the slit shape. That is, it is also possible to improve reliability of the pixel 2. Note that, it is preferable that w is greater than d in order to effectively reduce the generation of the void or the disconnection in the slit shape when the lattice portion 12 is formed.

However, depending on a design of the pixel 2, when the width w is reduced, the polarization characteristics are also able to be improved beyond the degradation of the polarization characteristics due to the generation of the void or the disconnection in the slit shape. Thus, the width w may be reduced also in the pixel 2 for the purpose of improving the extinction ratio.

(Effect of Image Capturing Apparatus 200)

As described above, the pixel 2 also makes it possible to realize an image capturing apparatus having more excellent polarization characteristics than a conventional image capturing apparatus. Additionally, since the width w is able to be increased, the image capturing apparatus 200 that is more excellent in a manufacturing cost and reliability than the image capturing apparatus 100 of Embodiment 1 described above is able to be realized.

(Variations in which Lattice Portions 12 are Arranged)

FIGS. 13(a) to (c) illustrate variations in which the lattice portions 12 are arranged in the pixel 2. Hereinafter, a slit width of the slit 132 of the second polarizer layer 120b is represented as a slit width s2. A width of the lattice portion 121 of the first polarizer layer 120a is represented as a width w1.

FIG. 13(a) illustrates arrangement of the lattice portions 12 similar to the arrangement in FIGS. 9 and 10 described above. That is, in FIG. 13(a), the slit width s2 and the width w1 are set to be equal, and the slit 132 and the lattice portion 121 overlap with each other without a gap as viewed from the Z direction. In other words, the slit 131 and the slit 132 do not overlap with each other as viewed from the Z direction.

The inventors found that, by arranging the lattice portions 12 as in FIG. 13(a), the polarization characteristics of the pixel 2 were particularly able to be improved as illustrated in FIG. 11 described above. Note that, the width w1 may be the same as or different from the width (referred to as a width w2 for convenience) of the lattice portion 122 of the second polarizer layer 120b.

FIG. 13(b) illustrates another example of arrangement of the lattice portions 12. Specifically, in FIG. 13(b), the width w1 is set to be wider than the slit width s2, and the lattice portion 121 is arranged so as to cover the slit 132 as viewed from the Z direction.

The inventors found that, although not as good as the configuration of FIG. 13(a), the polarization characteristics of the pixel 2 were able to be suitably improved by arranging the lattice portions 12 as in FIG. 13(b). Note that, in FIG. 13(b), the width w1 is set to be wider than the width w2 described above. For distinction, the lattice portion 121 having a wider width w1 is also referred to as a lattice portion 12x in FIG. 13(b).

FIG. 13(c) illustrates a still another example of arrangement of the lattice portions 12. Specifically, in FIG. 13(c), the slit width s2 is set to be wider than the width w1, and at least a part of the lattice portion 121 exists in a range of the slit width s2 as viewed from the Z direction. Thus, in FIG. 13(c), the slit 131 and the slit 132 overlap with each other as viewed from the Z direction. Note that, the configuration illustrated in FIG. 13(a) also has a configuration where, in order that the slit 131 and the slit 132 overlap with each other as viewed from the Z direction, for example, at least a part of the lattice portion 121 exists in a range of the slit width s2 as viewed from the Z direction even when a position of the lattice portion 121 is shifted in the Y direction.

The inventors found that, although not as good as the configuration of FIG. 13(a) or (b), the polarization characteristics of the pixel 2 were able to be suitably improved by arranging the lattice portions 12 as in FIG. 13(c). Note that, in FIG. 13(c), the width w1 is set to be narrower than the width w2 described above. For distinction, the lattice portion 121 having a narrower width w1 is also referred to as a lattice portion 12y in FIG. 13(c).

[Additional Examination 1]

The inventors further examined suitable numerical value ranges of the width w of the lattice portion 12 and the slit width s of the slit 13. As a result, the inventors newly found knowledge that the extinction ratio (R) described above depended on a value "w/s" of a ratio between the width w and the slit width s.

In view of the knowledge, the inventors conducted simulation similar to the simulation described above for the pixel 1 of Embodiment 1 and the pixel 2 of Embodiment 2 and examined a relationship between the value of w/s and the extinction ratio in each of the pixels.

Here, a sum (w+s) of the width w and the slit width s is referred to as a period Lc of the lattice portion 12. The inventors set the period Lc=w+s in a fixed manner in the simulation. The inventors conducted the simulation by setting the slit width s as s=Lc−w with the width w as a variable.

Figure 14:
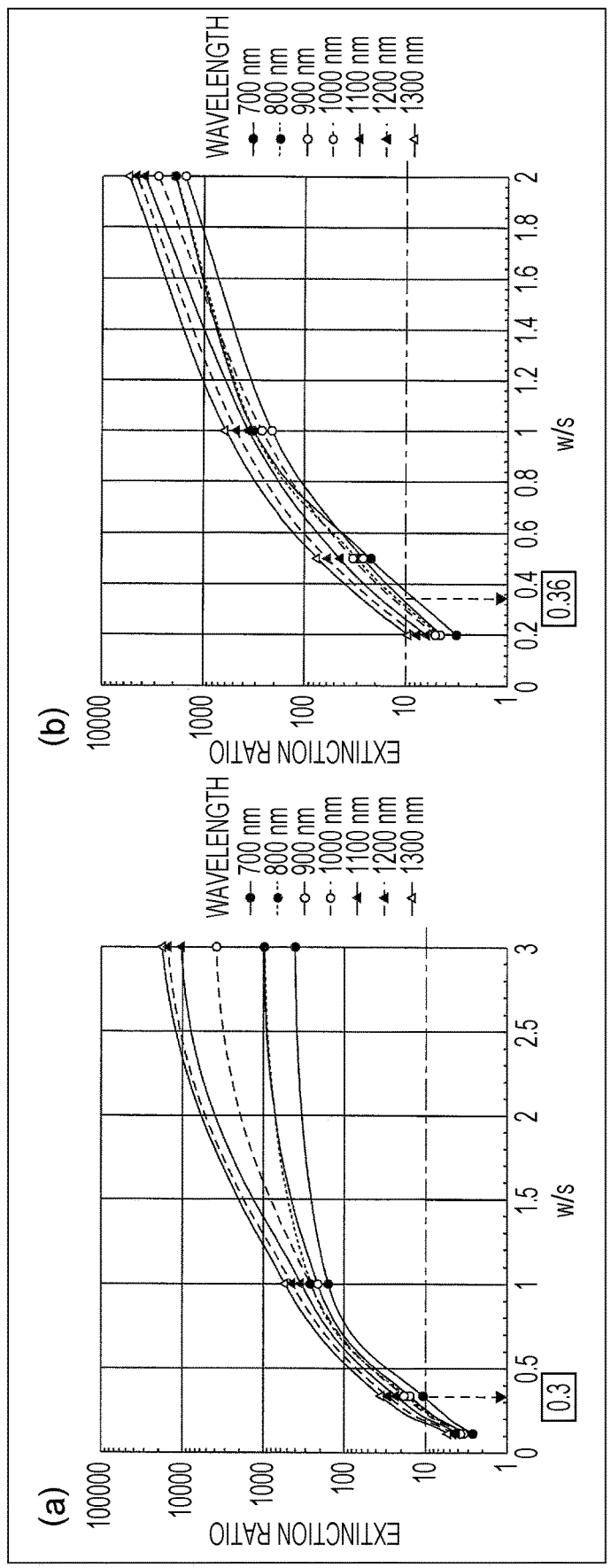
FIGS. 14(a) and (b) each illustrates a relationship between a value of w/s and the extinction ratio in a pixel according to an aspect of the disclosure.

FIGS. 14(a) and (b) are graphs each illustrating a relationship between the value of w/s and the extinction ratio in a pixel according to an aspect of the disclosure. In FIG. 14, a horizontal axis indicates the value of w/s and a vertical axis indicates the extinction ratio.

FIG. 14(a) is a graph illustrating a relationship between the value of w/s and the extinction ratio in the pixel 1. FIG. 14(a) illustrates a result obtained when the period Lc=200 nm is provided in the simulation. Conditions of the simulation, other than the width w and the slit width s, are similar to those of Embodiment 1. Note that, a case of w/s=1 corresponds to the configuration of FIG. 1 described above.

FIG. 14(b) is a graph illustrating a relationship between the value of w/s and the extinction ratio in the pixel 2. FIG. 14(b) illustrates a result obtained when the period Lc=300 nm is provided in the simulation. Conditions of the simulation, other than the width w and the slit width s, are similar to those of Embodiment 2. Note that, the case of w/s=1 corresponds to the configuration of FIG. 13(a) described above. A case of (i) w/s>1 corresponds to the configuration of FIG. 13(b) and a case of (ii) w/s<1 corresponds to the configuration of FIG. 13(c).

FIGS. 14(a) and (b) each illustrates the relationship between the value of w/s and the extinction ratio when the wavelength of light is set to "700 nm, 800 nm, 900 nm, 1000 nm, 1100 nm, 1200 nm, and 1300 nm" (seven wavelengths).

As illustrated in FIGS. 14(a) and (b), it was found that, with respect to any of the wavelengths, the extinction ratio tended to be improved as the value of w/s increased in each of the pixel 1 and the pixel 2. It was also found that the extinction ratio tended to be improved as the wavelength was longer, when the value of w/s was fixed.

Thus, by setting the value of w/s, it is possible to obtain a pixel having a desired extinction ratio with respect to a predetermined wavelength. As an example, considered is a case where a pixel having the extinction ratio of 10 or more is obtained by considering polarization characteristics of the pixel.

Then, as illustrated in FIG. 14(a), in the case of the pixel 1, it is preferable that the value of w/s is set with w/s≥0.3. Moreover, as illustrated in FIG. 14(b), in the case of the pixel 2, it is preferable that the value of w/s is set with w/s≥0.36. When the value of w/s is set in this manner, a pixel having the extinction ratio of 10 or more with respect to any wavelength of 700 nm or more is able to be obtained.

[Additional Examination 2]

As a result of additional examination, the inventors found knowledge that the extinction ratio depended on also the period Lc described above. In view of the knowledge, the inventors conducted the simulation for the pixel 1 and the pixel 2 and examined the relationship between the period Lc and the extinction ratio in each of the pixels.

The inventors examined a case of w=s (that is, the case of w/s=1) in the simulation. The inventors conducted the simulation by setting the width w and the slit width s as w=s=Lc/2 with the period Lc as a variable.

Figure 15:
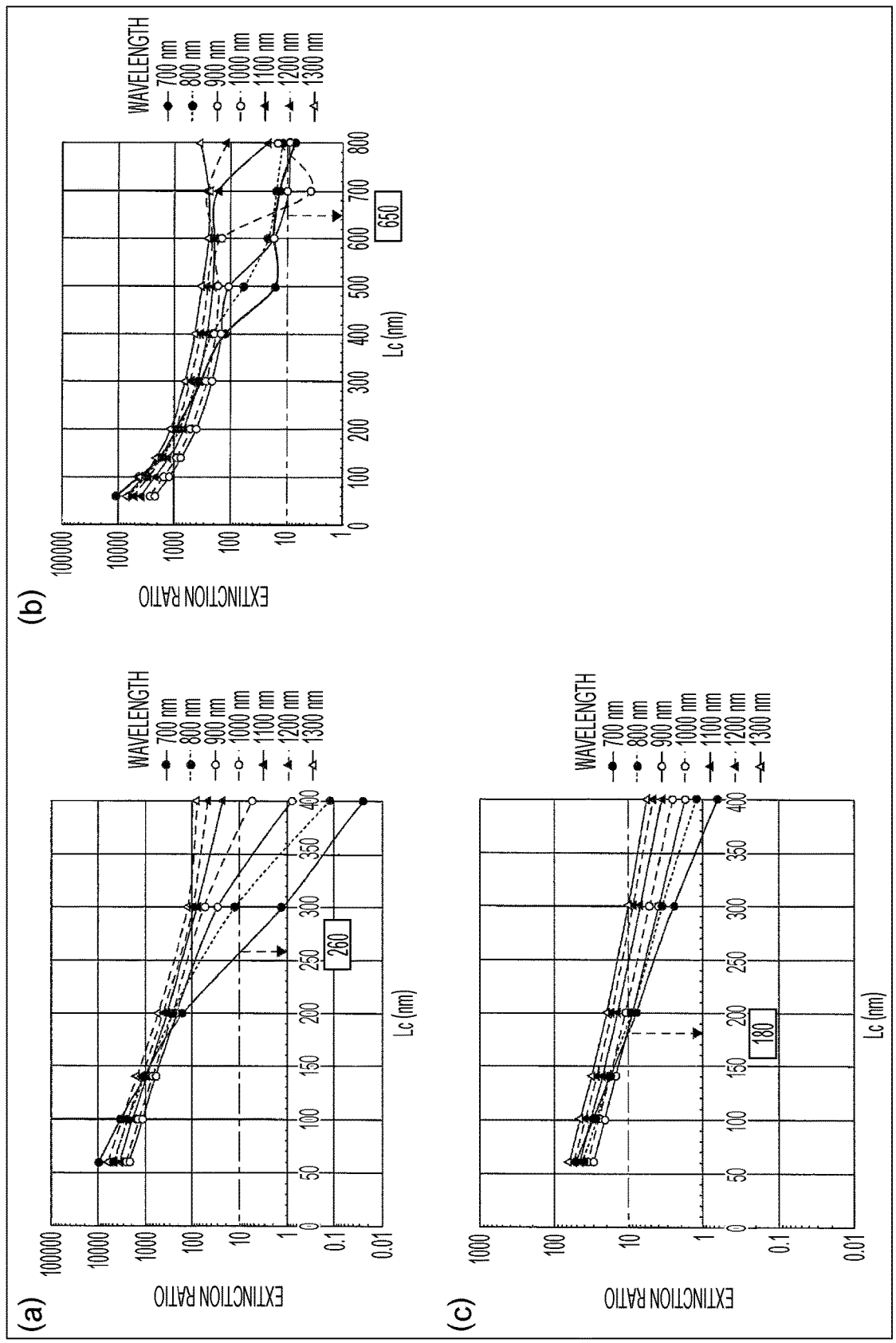
FIGS. 15(a) and (b) each illustrates a relationship between a period Lc of a lattice portion and the extinction ratio in a pixel according to an aspect of the disclosure.
FIG. 15(c) illustrates a relationship between the period Lc and the extinction ratio in the pixel as the comparative example.

FIGS. 15(a) and (b) are graphs each illustrating a relationship between Lc and the extinction ratio in a pixel according to an aspect of the disclosure. In FIG. 15, a horizontal axis indicates the period Lc and a vertical axis indicates the extinction ratio.

FIG. 15(a) is a graph illustrating a relationship between the period Lc and the extinction ratio in the pixel 1. In the simulation, conditions of the simulation, other than the width w and the slit width s, are similar to those of Embodiment 1.

FIG. 15(b) is a graph illustrating a relationship between the period Lc and the extinction ratio in the pixel 2. In the simulation, conditions of the simulation, other than the width w and the slit width s, are similar to those of Embodiment 2.

Further, for comparative examination, the inventors conducted the simulation also for the pixel 1X (configuration of FIG. 5) as a modified example described above and examined a relationship between the period Lc and the extinction ratio. FIG. 15(c) is a graph illustrating the relationship between the period Lc and the extinction ratio in the pixel 1X. In the simulation, conditions of the simulation, other than the width w and the slit width s, are similar to those of Embodiment 1.

FIGS. 15(a) to (c) each illustrate a relationship between the period Lc and the extinction ratio for the seven wavelengths described above. As illustrated in FIGS. 15(a) to (c), it was found that, with respect to any of the wavelengths, the extinction ratio tended to be reduced as the period Lc increased in the pixel 1, the pixel 2, and the pixel 1X. It was also found that the extinction ratio tended to be reduced as the wavelength was shorter, when the period Lc was fixed.

Thus, setting the period Lc also makes it possible to obtain a pixel having a desired extinction ratio with respect to a predetermined wavelength.

For example, as illustrated in FIG. 15(a), in the case of the pixel 1, the period Lc is preferably set with Lc≤260 nm. As illustrated in FIG. 14(b), in the case of the pixel 2, the period Lc is preferably set with Lc≤650 nm. When the period Lc is set in this manner, a pixel having the extinction ratio of 10 or more with respect to any wavelength of 700 nm or more is able to be obtained.

Note that, as illustrated in FIG. 15(c), in order to achieve the extinction ratio of 10 or more in the pixel 1X, the period Lc may be set with Lc≤180 nm.

[Additional Examination 3]

As a result of additional examination, the inventors found knowledge that the extinction ratio depended on also a shift amount ΔY (described later) of a pixel. In view of the knowledge, the inventors conducted the simulation for a pixel (hereinafter, also referred to as a first analysis pixel) illustrated in FIG. 16(a) and examined a relationship between the shift amount ΔY and the extinction ratio in the pixel.

Figure 16:
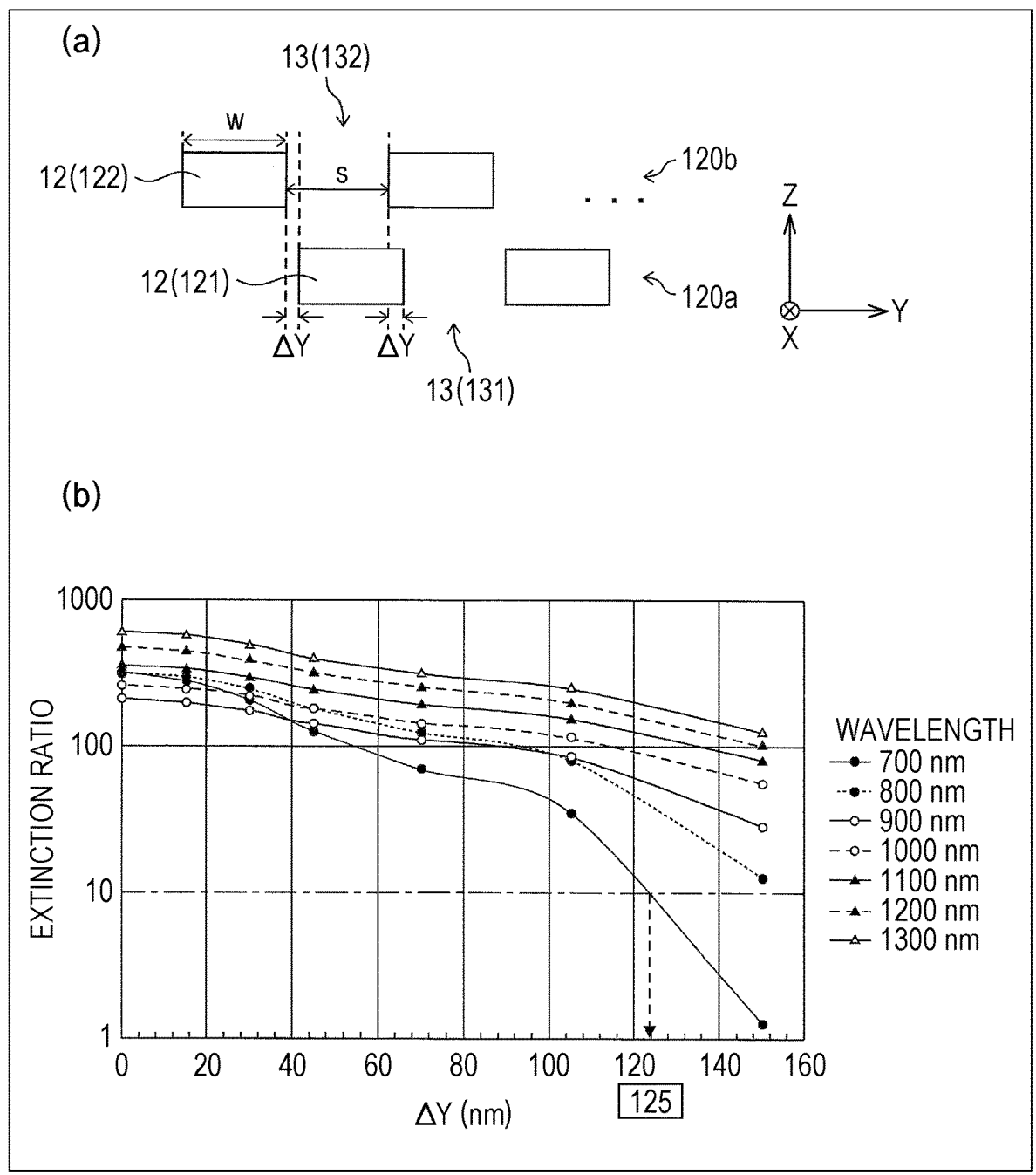
FIG. 16(a) is a view for explaining a shift amount ΔY of a pixel in a pixel according to an aspect of the disclosure and FIG. 16(b) illustrates a relationship between the shift amount ΔY and the extinction ratio.

FIG. 16(a) is a view for explaining the shift amount ΔY of the pixel in the first analysis pixel. As illustrated in FIG. 16(a), the first analysis pixel is a pixel in which a right end (end positioned in a positive direction of the Y direction) of one lattice portion 121 is separated from a left end (end positioned in a negative direction of the Y direction) of a lattice portion 122 by ΔY. The shift amount means ΔY in FIG. 16(a). The shift amount ΔY has a non-negative value.

The inventors set the width w and the slit width s to be fixed as w=s=150 nm in the simulation. Then, the inventors conducted the simulation with the shift amount ΔY as a variable. Other conditions of the simulation are similar to those of Embodiment 1 or 2.

Note that, a case of ΔY=0 nm corresponds to the configuration (pixel 2) of FIG. 9 described above. This is because, in the case of ΔY=0 nm, the lattice portion 121 and the lattice portion 122 are arranged so as not to (substantially) overlap with each other as viewed from the Z direction.

Moreover, a case of ΔY=150 nm corresponds to the configuration (pixel 1) of FIG. 1 described above. This is because, in the case of ΔY=150 nm, the lattice portion 121 and the lattice portion 122 are arranged so as to overlap with each other to a maximum degree as viewed from the Z direction.

FIG. 16(b) illustrates a relationship between the shift amount ΔY and the extinction ratio for the seven wavelengths described above. As illustrated in FIG. 16(b), it was found that, with respect to any of the wavelengths, the extinction ratio tended to be reduced as the shift amount ΔY increased. It was also found that the extinction ratio tended to be reduced as the wavelength was shorter, when the shift amount ΔY was fixed.

Thus, setting the shift amount ΔY also makes it possible to obtain a pixel having a desired extinction ratio with respect to a predetermined wavelength.

For example, in the case of FIG. 16(b), the shift amount ΔY is preferably set with 0 nm≤ΔY≤125 nm. When the shift amount ΔY is set in this manner, a pixel having the extinction ratio of 10 or more with respect to any wavelength of 700 nm or more is able to be obtained.

[Additional Examination 4]

As a result of additional examination, the inventors found knowledge that the extinction ratio depended on also the number of polarizer layers. In view of the knowledge, the inventors conducted the simulation and examined a relationship between the number of polarizer layers and the extinction ratio.

The inventors set the width w and the slit width s to be fixed as w=s=150 nm in the simulation. Then, the inventors conducted the simulation while changing the number of polarizer layers from one to four. Other conditions of the simulation are similar to those of Embodiment 1 or 2.

First, the inventors applied the simulation to the pixel 1X (FIG. 5) as a pixel when the number of polarizer layers is one.

Subsequently, when the number of polarizer layers is multiple (two or more), the inventors applied the simulation to a configuration of a pixel in which the lattice portion 121 and the lattice portion 122 are arranged so as to overlap with each other to a maximum degree.

Figure 17:
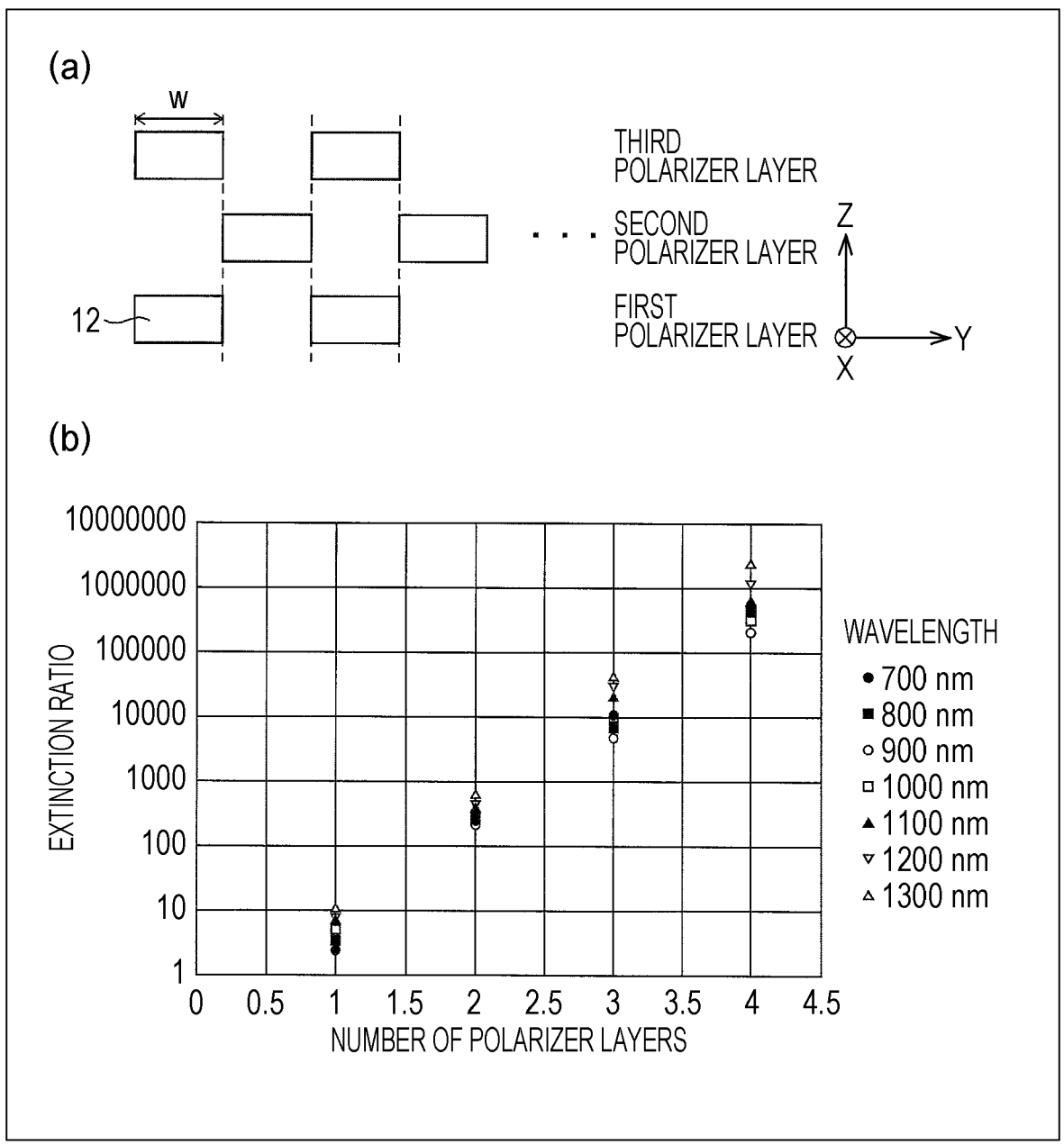
FIG. 17(a) illustrates a case where the number of polarizer layers is three in a pixel according to an aspect of the disclosure and FIG. 17(b) illustrates a relationship between the number of polarizer layers and the extinction ratio.

Then, the inventors used the pixel 2 (FIG. 9) in which the number of polarizer layers is multiple as the pixel when the number of polarizer layers is two. Next, the inventors used a pixel illustrated in FIG. 17(a) as a pixel (hereinafter, also referred to as a second analysis pixel) when the number of polarizer layers is three. As illustrated in FIG. 17(a), in the second analysis pixel, a polarizer layer farthest from the light receiving unit 11 (not illustrated in FIG. 17(a)) is referred to as a third polarizer layer.

The second analysis pixel has a configuration obtained by adding the third polarizer layer to the pixel 2. As illustrated in FIG. 17(a), in the second analysis pixel, a lattice portion 12 of the third polarizer layer is arranged so as to overlap with a lattice portion 12 (lattice portion 121 described above) of the first polarizer layer to a maximum degree as viewed from the Z direction.

Further, though not illustrated, the inventors used a pixel, which is obtained by adding a fourth polarizer layer to the second analysis pixel, as a pixel (hereinafter, also referred to as a third analysis pixel) when the number of polarizer layers is four. The fourth polarizer layer is a polarizer layer farthest from the light receiving unit 11 in the third analysis pixel. In the fourth analysis pixel, a lattice portion 12 of the fourth polarizer layer is arranged so as to overlap with a lattice portion 12 (lattice portion 122 described above) of the second polarizer layer to a maximum degree as viewed from the Z direction.

FIG. 17(b) illustrates a relationship between the number of polarizer layers and the extinction ratio for the seven wavelengths described above. As illustrated in FIG. 17(b), it was found that, with respect to any of the wavelengths, the extinction ratio tended to be improved as the number of polarizer layers increased. It was also found that the extinction ratio tended to be reduced as the wavelength was shorter, when the number of polarizer layers was fixed.

Thus, setting the number of polarizer layers also makes it possible to obtain a pixel having a desired extinction ratio with respect to a predetermined wavelength.

For example, in the case of FIG. 17(b), it is preferable that the number of polarizer layers is set so that the number of polarizer layers is two or more. When the number of polarizer layers is set in this manner, a pixel having the extinction ratio of 10 or more with respect to any wavelength of 700 nm or more is able to be obtained.

When the number of polarizer layers is greater than two, a pixel having a higher extinction ratio is able to be obtained. For example, when the number of polarizer layers is three, a pixel having the extinction ratio of 1000 or more with respect to any wavelength of 700 nm or more is able to be obtained.

Further, when the number of polarizer layers is four, a pixel having the extinction ratio of 100000 or more with respect to any wavelength of 700 nm or more is able to be obtained.

[Additional Examination 5]

As described above, in a pixel according to an aspect of the disclosure, a material of each of a polarizer layer and a wiring layer may be a material selected from Al, Si, Cu, Au, Ag, Pt, W, Ti, Sn, In, Ga, Zn, and a compound or alloy that contains at least one of the foregoing.

The inventors performed additional examination to find a more suitable material for each of the polarizer layer and the wiring layer. An examination result thereof will be described below.

(Material of Wiring Layer)

The material of the wiring layer preferably has high reliability, easy processability, and low electric resistance.

Specifically, the material of the wiring layer is preferably a material selected from Al, Cu, Ti, W, Sn, and a compound or alloy that contains at least one of the foregoing.

(Material of Polarizer Layer)

Generally, a material (substance) has a specific complex refractive index m. The complex refractive index m is represented as $$m = n + ik.$$

A real part of the complex refractive index m is referred to as a refractive index n and an imaginary part thereof is referred to as an extinction coefficient k. Note that, i indicates an imaginary unit. The complex refractive index m is used as one of indexes indicating optical characteristics of the material.

Each of the refractive index n and the extinction coefficient k generally depends on a wavelength $\lambda$ of light. Thus, the refractive index n and the extinction coefficient k are able to be represented as a function $n(\lambda)$ and a function $k(\lambda)$ of the wavelength $\lambda$, respectively. Thus, the complex refractive index m is also represented as $$m(\lambda) = n(\lambda) + ik(\lambda)$$

as the function of the wavelength $\lambda$. The complex refractive index $m(\lambda)$ (in other words, each of the refractive index $n(\lambda)$ and the extinction coefficient $k(\lambda)$) is specific to each material.

The material of the polarizer layer is preferably selected from the aforementioned materials that are able to improve polarization characteristics. Thus, the material of the polarizer layer is preferably a material having a small refractive index n and a large extinction coefficient k. A reason therefor will be described below.

In general, a material has a specific complex dielectric constant $\epsilon$. The complex dielectric constant $\epsilon$ is represented as $$\epsilon = \epsilon 1 + i\epsilon 2.$$

Note that, a real part $\epsilon 1$ of the complex dielectric constant $\epsilon$ is represented as $\epsilon 1 = n^2 - k^2$.

It is known that, in a case where a value of the real part $\epsilon 1$ is small, electrons contributing to transmission of light become easy to move freely in the material. Thus, in the case where the value of the real part $\epsilon 1$ is small, a transmittance of the light of the material is able to be increased.

Accordingly, as the material of the polarizer layer, for example, a material whose real part $\epsilon 1$ is small in a range of the wavelength $\lambda$ of light to be polarized is preferably selected. As described above, when the material having a small refractive index n and a large extinction coefficient k is selected, a material whose real part $\epsilon 1$ is small (that is, a material whose transmittance of light is high) is able to be selected.

Moreover, the material of the polarizer layer more preferably satisfies a relation of $n(\lambda) < k(\lambda)$ in the range of the wavelength h of light to be polarized, for example. In a case where the relation is satisfied, the real part $1i$ is negative and the transmittance of light of the material is able to be further increased.

A difference dif between the extinction coefficient k and the refractive index n is represented as $dif = k - n$. A material having a greater difference dif is expected to have at least one of a smaller refractive index n and a greater extinction coefficient k. Thus, a material having a great difference dif is more preferably selected.

Figure 18:
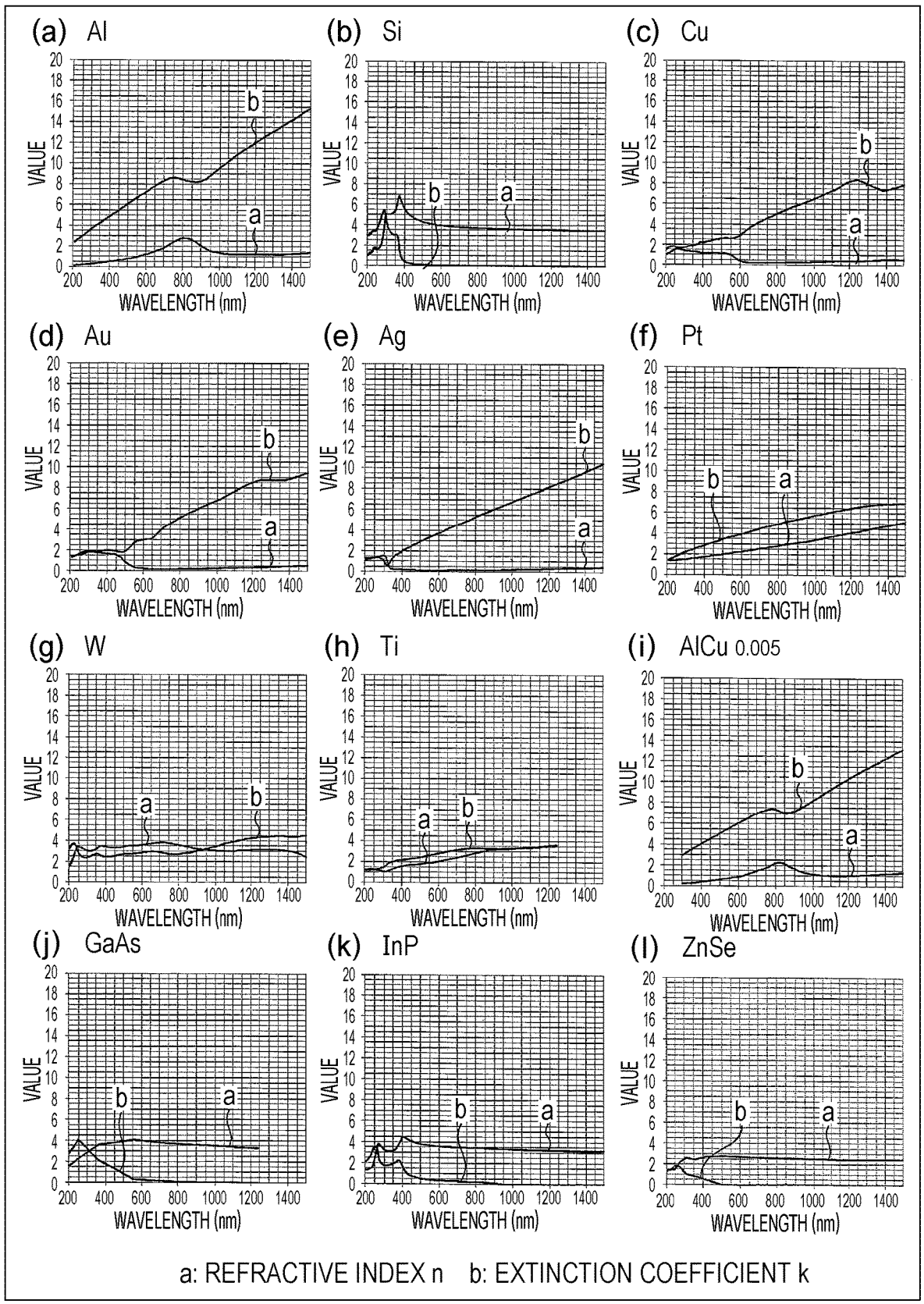
FIGS. 18(a) to (l) each illustrates a relationship between the wavelength of light, a refractive index n, and an extinction coefficient k in each material used in a pixel according to an aspect of the disclosure.

In view of the foregoing examination result, the inventors examined refractive indexes $n(\lambda)$ and extinction coefficients $k(\lambda)$ of various materials used as the material of the polarizer layer. FIGS. 18(*a*) to (*l*) are graphs each illustrating an example of a result of the examination. In each of the graphs, a horizontal axis indicates the wavelength $\lambda$ and a vertical axis indicates values of the refractive index $n(\lambda)$ and the extinction coefficient $k(\lambda)$.

Specifically, FIGS. 18(*a*) to (*l*) illustrate results of the examination related to "Al", "Si", "Cu", "Au", "Ag", "Pt", "W", "Ti", "AlCu$_{0.005}$", "GaAs", "InP", and "ZnSe", respectively.

As an example, as illustrated in FIG. 18(*g*), W achieves $n(\lambda) < k(\lambda)$ in a case of $\lambda > 950$ nm. Thus, it is understood that W may be used for the suitable material of the polarizer layer when light with $\lambda \geq 950$ nm is polarized. Further, as illustrated in FIG. 18(*l*), ZnSe achieves $n(\lambda) < k(\lambda)$ in a case of $\lambda \approx 250$ nm. Thus, ZnSe may be used when light with $\lambda \approx 250$ nm is polarized.

It was found that, among the materials described above, Al, Cu, Au, Ag, and Pt (refer to FIGS. 18 (*a*), (*c*), (*d*), (*e*), and (*f*)) achieved $n(\lambda) < k(\lambda)$ in a wide range of the wavelength $\lambda$ and had a great difference dif.

In view of the results of the examination, the inventors found that it was particularly preferable that the material of the wiring layer was a material selected from Al, Cu, Au, Ag, Pt, and a compound or alloy that contains at least one of the foregoing.

(Combination of Material of Wiring Layer and Material of Polarizer Layer)

From a viewpoint of facilitating manufacturing an image capturing apparatus (pixel) according to an aspect of the disclosure, it is preferable that the same material is selected as the material of the wiring layer and the material of the polarizer layer.

A manufacturing process of the image capturing apparatus includes a step of forming a part of the wiring layer and a step of forming the polarizer layer. In a case where the same material is used as the material of the wiring layer and the material of the polarizer layer, both the polarizer layer and the wiring layer are able to be formed on the same plane in the step of forming a part of the wiring layer. That is, the step of forming a part of the wiring layer is able to include the step of forming the polarizer layer. Thus, manufacturing of the image capturing apparatus is facilitated.

The inventors found that, in a case where the same material was used as the material of the wiring layer and the material of the polarizer layer, it was particularly preferable that the material was a material selected from Al, Cu, AlCu, and a compound or alloy that contains at least one of the foregoing, from a viewpoint of facilitating manufacturing the image capturing apparatus.

[Supplement 1]

For convenience of description, a case where a shape (hereinafter, sectional shape) of a sectional surface of a lattice portion in a polarizer layer is a rectangle shape in the YZ plane is exemplified in the foregoing embodiments. However, the sectional shape is not limited only to the rectangle shape in a pixel according to an aspect of the disclosure. The sectional shape may be any shape.

Figure 19:
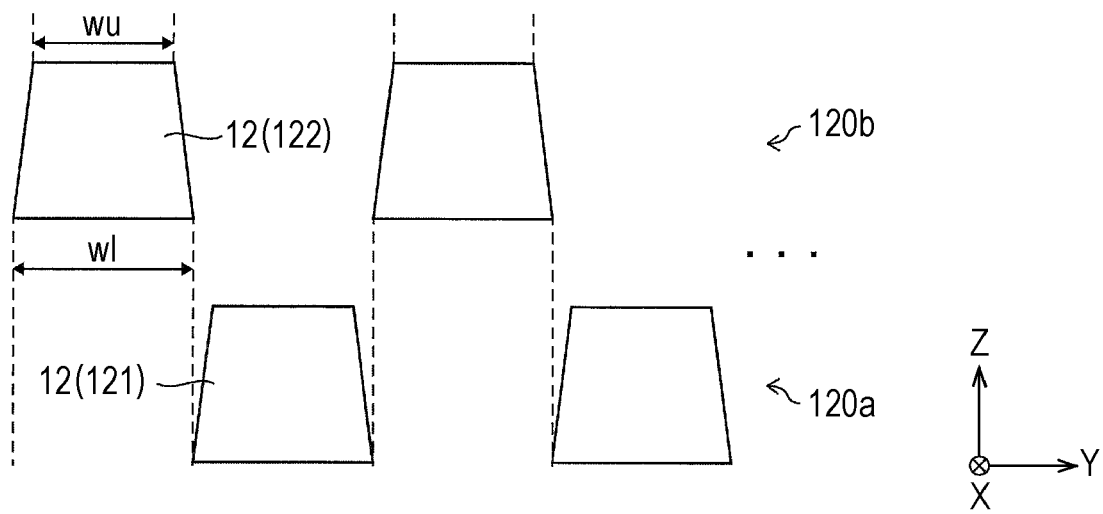
FIG. 19 is a view for explaining another example of a sectional shape of a lattice portion in a YZ plane in a pixel according to an aspect of the disclosure.

FIG. 19 is a view for explaining another example of the sectional shape in a pixel according to an aspect of the disclosure. For example, even when the sectional shape of the lattice portion is designed as a rectangle shape in the pixel according to the aspect of the disclosure, a sectional shape in an ideal (in the strict sense) rectangle shape is not always obtained in the manufacturing process of the image capturing apparatus.

Specifically, there is a case where a lattice portion 12 is formed so that a length wu of an upper side (side that is parallel to the Y direction and positioned on a positive side of the Z direction) of the lattice portion 12 and a length w1 of a lower side (side that is parallel to the Y direction and positioned on a negative side of the Z direction) of the lattice portion 12 satisfy a relation of wu≠w1, as illustrated in FIG. 19. That is, a sectional shape in a substantially trapezoid shape may be obtained.

The lattice portion 12 may be formed in this manner as long as desired polarization characteristics are able to be realized in the pixel. The sectional shape is not particularly limited as long as desired polarization characteristics are satisfied.

[Supplement 2]

The image capturing apparatus according to an aspect of the disclosure may further include a spectral filter that transmits only light of a specific wavelength region. The spectral filter may be a filter formed of an organic material or a filter formed of an inorganic material.

CONCLUSION

In an image capturing apparatus (100) according to an aspect 1 of the disclosure, the image capturing apparatus includes an image sensor (light receiving unit 11) that includes a pixel (1) provided with a polarizing unit (10), in which the pixel includes a wiring layer (19) that controls an operation of the image sensor, the polarizing unit includes a plurality of polarizer layers (first polarizer layer 120a, second polarizer layer 120b) and a dielectric layer (14) that is arranged between two adjacent polarizer layers among the plurality of polarizer layers, a plurality of slits (13) that are arranged at regular intervals in a predetermined direction are formed in each of the plurality of polarizer layers, and a forming material of each of the plurality of polarizer layers and a forming material of the wiring layer are selected from Al, Si, Cu, Au, Ag, Pt, W, Ti, Sn, In, Ga, Zn, and a compound or alloy that contains at least one of the foregoing.

According to the aforementioned configuration, the polarizer layer in which the plurality of slits that are arranged at regular intervals in the predetermined direction are formed reflects and absorbs a polarized component having a polarized wave surface parallel to an extension direction of the slits and transmits a polarized component having a polarized wave surface vertical to the extension direction of the slits. The polarizing unit includes the plurality of polarizer layers, which function in such a manner, with the dielectric layer held therebetween. Thereby, it is possible to provide an image capturing apparatus that reduces a transmittance of a polarized component that is not desired to be transmitted and improves polarization characteristics.

Moreover, while polarization characteristics of a polarizing filter are able to be improved as a width of a lattice portion held between adjacent slits is narrower, there is an increased risk of generating a void or disconnection in a slit shape by stress migration. According to the aforementioned configuration, however, the polarization characteristics of the polarizing filter are able to be improved compared to a related art in which a polarizer layer has a single layer, so that the width of the lattice portion is able to be set to be narrower than that of the related art. This is because the polarization characteristics are able to be improved beyond degradation of the polarization characteristics due to the generation of the void or the disconnection in the slit shape.

Further, to the contrary, by making the width of the lattice portion held between the adjacent slits wider than that of the related art, it is possible to avoid generation of the void or the disconnection in the slit shape due to the stress migration and further facilitate manufacturing the polarizing unit compared to the related art. This is because the polarization characteristics are able to be improved beyond degradation of the polarization characteristics due to widening of the width of the lattice portion.

Note that, as a combination of the forming material of the polarizer layer and the forming material of the wiring layer, a combination that improves the polarization characteristics as much as possible is preferably selected.

In the aspect 1, in the image capturing apparatus according to an aspect 2 of the disclosure, each of the plurality of polarizer layers may include a plurality of lattice portions (12) that are arranged at regular intervals in the predetermined direction, and one of the plurality of slits may be arranged between two adjacent lattice portions among the plurality of lattice portions, and in a case where, out of the two adjacent polarizer layers, a polarizer layer closer to the image sensor (11) is a first polarizer layer (120a) and a polarizer layer farther from the image sensor (11) is a second polarizer layer (120b), and an interval between the two adjacent lattice portions is a width (slit width s, slit width s2) of a slit, in a range of the width of the slit (132) of the second polarizer layer, at least a part of a lattice portion (121) of the first polarizer layer may exist as viewed from a normal direction of the second polarizer layer.

According to the aforementioned configuration, various kinds of setting are allowed for a positional relationship between the lattice portion of the first polarizer layer and the lattice portion of the second polarizer layer with respect to the normal direction of the second polarizer layer. For example, (i) a first plane passing through a center of the lattice portion of the first polarizer layer so as to be parallel to the normal direction of the second polarizer layer and (ii) a second plane passing through a center of the lattice portion of the second polarizer layer so as to be parallel to the normal direction of the second polarizer layer may be the same plane. In a case of such a configuration, when the width of the lattice portion of the first polarizer layer and the width of the lattice portion of the second polarizer layer are the same, the lattice portion of the first polarizer layer and the lattice portion of the second polarizer layer overlap with each other as viewed from the normal direction of the second polarizer layer. Such a configuration also makes it possible to improve the polarization characteristics of the polarizing filter compared to the related art in which the polarizer layer has a single layer.

However, when the configuration where at least a part of the lattice portion of the first polarizer layer exists in the range of the width of the slit of the second polarizer layer as viewed from the normal direction of the second polarizer layer is adopted, the polarization characteristics of the polarizing filter are able to be further improved.

In the aspect 2, in the image capturing apparatus according to an aspect 3 of the disclosure, the width (slit width s, slit width s2) of the slit (132) of the second polarizer layer and a width (w, w1) of the lattice portion (121) of the first polarizer layer may be set to be equal, and the slit of the second polarizer layer and the lattice portion of the first polarizer layer may overlap with each other substantially without a gap as viewed from the normal direction.

According to the aforementioned configuration, the polarization characteristics of the polarizing filter are able to be further improved. Note that, "overlapping with each other substantially without a gap" means including a portion where a gap is generated in overlapping or including a case where the gap is generated in the overlapping, due to a manufacturing error. Moreover, the width of the lattice portion of the first polarizer layer and the width of the lattice portion of the second polarizer layer may be same or different. Further, the aforementioned configuration according to the aspect 3 may be also expressed as "the slit of the second polarizer layer and the slit of the first polarizer layer may not overlap with each other as viewed from the normal direction".

In the aspect 2, in the image capturing apparatus according to an aspect 4 of the disclosure, a width (w1) of the lattice portion (121) of the first polarizer layer may be set to be wider than the width (slit width s2) of the slit (132) of the second polarizer layer, and the lattice portion of the first polarizer layer may be arranged so as to cover the slit of the second polarizer layer as viewed from the normal direction.

In the aspect 1, in the image capturing apparatus according to an aspect 5 of the disclosure, each of the plurality of polarizer layers (first polarizer layer 120a, second polarizer layer 120b) may include a plurality of lattice portions (12) that are arranged at regular intervals in the predetermined direction, and one of the plurality of slits (13) may be arranged between two adjacent lattice portions among the plurality of lattice portions, and in a case where, out of the two adjacent polarizer layers, a polarizer layer closer to the image sensor is a first polarizer layer (120a) and a polarizer layer farther from the image sensor is a second polarizer layer (120b), and an interval between the two adjacent lattice portions is a width (slit width s, slit width s2) of a slit, a lattice portion (122) of the second polarizer layer and a lattice portion (121) of the first polarizer layer may have arrangement that provides maximum overlapping in arrangement that provides overlapping as viewed from the normal direction of the second polarizer layer.

According to the aforementioned configuration, various kinds of setting are allowed for a positional relationship between the lattice portion of the first polarizer layer and the lattice portion of the second polarizer layer with respect to the normal direction of the second polarizer layer. Among such various kinds of setting, setting in which the lattice portion of the second polarizer layer and the lattice portion of the first polarizer layer overlap with each other to a maximum degree may be selected. In the setting, (i) a first plane passing through a center of the lattice portion of the first polarizer layer so as to be parallel to the normal direction of the second polarizer layer and (ii) a second plane passing through a center of the lattice portion of the second polarizer layer so as to be parallel to the normal direction of the second polarizer layer may be the same plane.

Such a configuration also makes it possible to improve the polarization characteristics of the polarizing filter compared to the related art in which the polarizer layer has a single layer.

In any one of the aspects 1 to 5, in the image capturing apparatus according to an aspect 6 of the disclosure, the forming material of each of the plurality of polarizer layers and the forming material of the wiring layer may be the same.

In any one of the aspects 1 to 6, in the image capturing apparatus according to an aspect 7 of the disclosure, at least one polarizer layer (first polarizer layer 120a) of the plurality of polarizer layers may constitute the same layer as the wiring layer.

According to the aforementioned configuration, since at least one polarizer layer of the plurality of polarizer layers of the polarizing unit constitutes the same layer as the wiring layer of the image sensor, the polarizing unit is able to be formed during a manufacturing process of the image sensor. Thus, a step of combining the polarizing filter and the image capturing apparatus is not required and it is possible to accurately position the polarizing unit and a pixel of the image sensor. Further, manufacturing of the polarizer layers is facilitated.

[Supplementary Note]

The disclosure is not limited to each of the foregoing embodiments, and may be modified in various manners within the scope indicated in the claims and an embodiment achieved by appropriately combining technical means disclosed in each of different embodiments is also encompassed in the technical scope of the disclosure. Further, by combining the technical means disclosed in each of the embodiments, a new technical feature may be formed.

CROSS REFERENCE TO RELATED APPLICATION

This application claims priority based on Japanese Patent Application No. 2016-091839 filed in Japan on Apr. 28, 2016, the content of which is incorporated herein by reference.

REFERENCE SIGNS LIST 1, 1A, 1B, 2 pixel
10 polarizing unit
11 light receiving unit (image sensor)
12, 12A, 12B, 12x, 12y, 121, 122 lattice portion
13, 13A, 13B, 131, 132 slit
14 dielectric layer
19 wiring layer
100, 200 image capturing apparatus
120 polarizer layer
120a first polarizer layer (polarizer layer)
120b second polarizer layer (polarizer layer)
s slit width (width of slit)
s2 slit width (width of slit of second polarizer layer)
w width (width of lattice portion)
w1 width (width of lattice portion of first polarizer layer)

The invention claimed is:

1. An image capturing apparatus comprising:
an image sensor that includes a pixel provided with a polarizing unit, wherein
the pixel includes a wiring layer that controls an operation of the image sensor,
the polarizing unit includes
a plurality of polarizer layers in each of which a plurality of slits that are arranged at regular intervals in a predetermined direction are formed and
a dielectric layer that is arranged (i) between two adjacent slits among the plurality of slits or (ii) between two adjacent polarizer layers among the plurality of polarizer layers, in a normal direction of each of the plurality of polarizer layers,
each of the plurality of polarizer layers includes a plurality of lattice portions that are arranged at regular intervals in the predetermined direction, and one of the plurality of slits is arranged between two adjacent lattice portions among the plurality of lattice portions in the predetermined direction,
each of the plurality of lattice portions satisfies a relation of $w>d$,
where the predetermined direction is a width direction and the normal direction is a thickness direction,
a width of each of the plurality of lattice portions is w, and a thickness of each of the plurality of lattice portions is d, and a forming material of each of the plurality of polarizer layers and a forming material of the wiring layer are selected from Al, Cu, Au, Ag, Pt, Ti, Sn, In, Ga, Zn, and a compound or alloy that contains at least one of the foregoing.

2. The image capturing apparatus according to claim 1, wherein
in a case where, out of the two adjacent polarizer layers, a polarizer layer closer to the image sensor is a first polarizer layer and a polarizer layer farther from the image sensor is a second polarizer layer, and an interval between the two adjacent lattice portions is a width of a slit,
in a range of the width of the slit of the second polarizer layer, at least a part of the lattice portion of the first polarizer layer exists as viewed from the normal direction.

3. The image capturing apparatus according to claim 2, wherein
the width of the slit of the second polarizer layer and the width of the lattice portion of the first polarizer layer are set to be equal, and
the slit of the second polarizer layer and the lattice portion of the first polarizer layer overlap with each other substantially without a gap as viewed from the normal direction.

4. The image capturing apparatus according to claim 3, wherein
the forming material of each of the plurality of polarizer layers and the forming material of the wiring layer are the same.

5. The image capturing apparatus according to claim 3, wherein
at least one polarizer layer of the plurality of polarizer layers constitutes the same layer as the wiring layer.

6. The image capturing apparatus according to claim 4, wherein
at least one polarizer layer of the plurality of polarizer layers constitutes the same layer as the wiring layer.

7. The image capturing apparatus according to claim 2, wherein
the width of the lattice portion of the first polarizer layer is set to be wider than the width of the slit of the second polarizer layer, and
the lattice portion of the first polarizer layer is arranged so as to cover the slit of the second polarizer layer as viewed from the normal direction.

8. The image capturing apparatus according to claim 7, wherein
the forming material of each of the plurality of polarizer layers and the forming material of the wiring layer are the same.

9. The image capturing apparatus according to claim 7, wherein
at least one polarizer layer of the plurality of polarizer layers constitutes the same layer as the wiring layer.

10. The image capturing apparatus according to claim 8, wherein
at least one polarizer layer of the plurality of polarizer layers constitutes the same layer as the wiring layer.

11. The image capturing apparatus according to claim 2, wherein
the forming material of each of the plurality of polarizer layers and the forming material of the wiring layer are the same.

12. The image capturing apparatus according to claim 11, wherein
at least one polarizer layer of the plurality of polarizer layers constitutes the same layer as the wiring layer.

13. The image capturing apparatus according to claim 2, wherein
at least one polarizer layer of the plurality of polarizer layers constitutes the same layer as the wiring layer.

14. The image capturing apparatus according to claim 1, wherein
in a case where, out of the two adjacent polarizer layers, a polarizer layer closer to the image sensor is a first polarizer layer and a polarizer layer farther from the image sensor is a second polarizer layer, and an interval between the two adjacent lattice portions is a width of a slit,
the lattice portion of the second polarizer layer and the lattice portion of the first polarizer layer have arrangement that provides maximum overlapping in arrangement that provides overlapping as viewed from the normal direction.

15. The image capturing apparatus according to claim 14, wherein
the forming material of each of the plurality of polarizer layers and the forming material of the wiring layer are the same.

16. The image capturing apparatus according to claim 15, wherein
at least one polarizer layer of the plurality of polarizer layers constitutes the same layer as the wiring layer.

17. The image capturing apparatus according to claim 14, wherein
at least one polarizer layer of the plurality of polarizer layers constitutes the same layer as the wiring layer.

18. The image capturing apparatus according to claim 1, wherein
the forming material of each of the plurality of polarizer layers and the forming material of the wiring layer are the same.

19. The image capturing apparatus according to claim 18, wherein
at least one polarizer layer of the plurality of polarizer layers constitutes the same layer as the wiring layer.

20. The image capturing apparatus according to claim 1, wherein
at least one polarizer layer of the plurality of polarizer layers constitutes the same layer as the wiring layer.

* * * * *